United States Patent
Toriumi

(10) Patent No.: US 9,252,749 B2
(45) Date of Patent: Feb. 2, 2016

(54) CLOCK GENERATION DEVICE, ELECTRONIC APPARATUS, MOVING OBJECT, AND CLOCK GENERATION METHOD

(71) Applicant: Seiko Epson Corporation, Tokyo (JP)

(72) Inventor: Yuichi Toriumi, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/528,200

(22) Filed: Oct. 30, 2014

(65) Prior Publication Data
US 2015/0116021 A1   Apr. 30, 2015

(30) Foreign Application Priority Data
Oct. 31, 2013   (JP) ................................. 2013-227071

(51) Int. Cl.
*H03K 3/011* (2006.01)
(52) U.S. Cl.
CPC ...................................... *H03K 3/011* (2013.01)
(58) Field of Classification Search
USPC ......................... 327/90–91, 94, 291–292, 298
See application file for complete search history.

(56) References Cited

U.S. PATENT DOCUMENTS 8,896,359 B1 * 11/2014 Ruffieux .................. G04G 3/04
327/262
8,975,970 B2 * 3/2015 Sonntag .................... H03L 7/00
327/155

FOREIGN PATENT DOCUMENTS

JP       2004-153332 A    5/2004
JP       2006-309479 A    11/2006

* cited by examiner

*Primary Examiner* — An Luu
(74) *Attorney, Agent, or Firm* — Harness, Dickey & Pierce, P.L.C.

(57) ABSTRACT

A clock generation device measures a frequency ratio between a clock signal CK1 (32.768 kHz+$\alpha$) and a reference frequency value based on a clock signal CK3 (25 MHz), generates a clock signal CK2 obtained by masking at least one clock pulse of the clock signal CK1 based on the measurement result of the frequency ratio, and controls the measurement interval of the frequency ratio based on the difference between the measurement result of the frequency ratio and an average value of N (N is a natural number) measurement results of the frequency ratio.

13 Claims, 17 Drawing Sheets

| CLOCK PULSE COUNT (N/2) AT 32.768 kHz+α | MEASUREMENT TIME ($T_{meas}$) [ms] | REFERENCE VALUE (F) | COUNT VALUE OF CLOCK PULSE AT 25 MHz | MASK NUMBER (K) | CORRECTION TIME ($T_{comp}$) [s] | CORRECTION ACCURACY [ppm] |
|---|---|---|---|---|---|---|
| 64 | 1.7578125 | 48,828 | 43,945 | 4,883 | 1.34 | 20.48 |
| 128 | 3.515625 | 97,656 | 87,890 | 9,766 | 2.68 | 10.24 |
| 256 | 7.03125 | 195,312 | 175,781 | 19,531 | 5.36 | 5.12 |
| 512 | 14.0625 | 390,625 | 351,562 | 39,063 | 10.73 | 2.56 |
| 1024 | 28.125 | 781,250 | 703,124 | 78,126 | 21.46 | 1.28 |
| 2048 | 56.25 | 1,562,500 | 1,406,248 | 156,252 | 42.92 | 0.64 |

FIG. 5

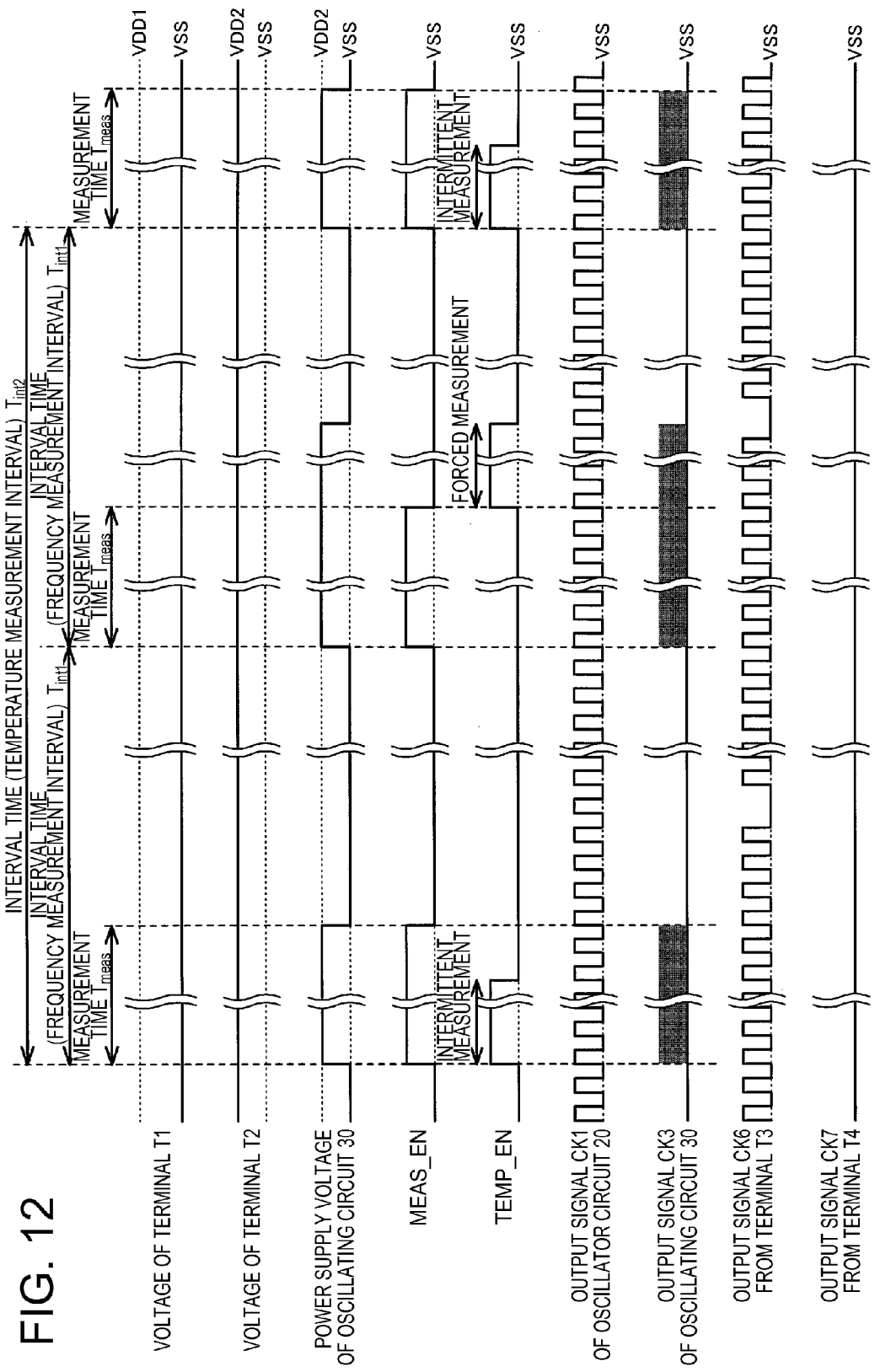

$z(i)=(z(i-1)+L)$ mod G (L=481, G=390625)

CLOCK GENERATION DEVICE, ELECTRONIC APPARATUS, MOVING OBJECT, AND CLOCK GENERATION METHOD

BACKGROUND

1. Technical Field

The present invention relates to a clock generation device, an electronic apparatus, a moving object, and a clock generation method.

2. Related Art

In JP-A-2006-309479 (Document 1), there is proposed a clock correction circuit, which counts the number of pulses of a main clock included in one cycle of a sub-clock, and then masks a part of the main clock so that the number of pulses of the main clock included in one cycle of the sub-clock is equal to a predetermined reference pulse number using the number of the pulses and the reference pulse number, and then outputs the main clock.

However, in the clock correction circuit proposed in Document 1, since an updating cycle of a clock correction value is kept constant, there is a problem that in an environment with severe temperature changes, there are some cases in which the updating cycle of the clock correction value is too long to sufficiently correct the frequency variation of the main clock due to the temperature variation, and thus the frequency stability of the output clock is deteriorated, while in an environment with gentle temperature changes, on the contrary, there are some cases in which the updating cycle of the clock correction value is too short, and thus the current due to an operation of counting the number of pulses of the main clock is consumed in vain.

SUMMARY

An advantage of some aspects of the invention is to provide a clock generation device, an electronic apparatus, a moving object, and a clock generation method each capable of generating a clock signal relatively high in frequency stability while reducing wasteful power consumption.

The invention can be implemented as the following aspects or application examples.

APPLICATION EXAMPLE 1

A clock generation device according to this application example is adapted to measure a frequency ratio between a first clock signal and a reference frequency value based on a third clock signal, generate a second clock signal obtained by masking at least one clock pulse of the first clock signal based on the measurement result of the frequency ratio, and update a compensation value of a frequency-temperature characteristic of the third clock signal in a case in which a difference between the measurement result of the frequency ratio and an average value of N (N is a natural number) measurement results of the frequency ratio is larger than a first reference value.

The clock generation device according to this application example includes the case of N=1, namely the case in which the compensation value of the frequency-temperature characteristic of the third clock signal is updated if the difference between the present measurement result of the frequency ratio and the previous measurement result of the frequency ratio is larger than the first reference value.

According to the clock generation device according to this application example, since the difference between the measurement result of the frequency ratio and the average value of N measurement results of the frequency ratio becomes larger than the first reference value if the change in environmental temperature is rapid, by forcibly updating the compensation value (the temperature compensation value) of the frequency-temperature characteristic of the third clock signal, the frequency stability of the third clock signal can be maintained. Thus, the second clock signal high in frequency stability corresponding to the frequency stability of the third clock signal can be generated.

Further, according to the clock generation device according to this application example, by masking at least one clock pulse of the first clock signal, it is possible to generate the second clock signal of a desired frequency (a desired average frequency) while eliminating or simplifying the frequency variable mechanism (e.g., a temperature compensation circuit) of the first clock signal.

APPLICATION EXAMPLE 2

In the clock generation device according to the application example described above, the compensation value may be intermittently updated in a case in which the difference is within the first reference value.

According to the clock generation device according to to this application example, since the difference between the measurement result of the frequency ratio and the average value of N measurement results of the frequency ratio becomes within the first reference value if the change in environmental temperature is gentle, by intermittently updating the compensation value of the third clock signal, the frequency stability of the third clock signal can be maintained. Further, according to the clock generation device according to this application example, since the temperature compensation value of the third clock signal is forcibly updated in the case in which the change in environmental temperature is rapid, the cycle of the intermittent update of the temperature compensation value of the third clock signal can be set to be relatively long. Thus, the second clock signal high in frequency stability corresponding to the frequency stability of the third clock signal can be generated while reducing the power consumed by the unnecessary update of the temperature compensation value.

APPLICATION EXAMPLE 3

The clock generation device according to the application example described above may include a clock gate section adapted to generate the second clock signal, a frequency measurement section adapted to measure the frequency ratio, an oscillating circuit including a compensation device adapted to output the compensation value, and outputting the third clock signal on which temperature compensation is performed based on the compensation value, an average value output section adapted to output the average value, and a comparison section adapted to compare the measurement result of the frequency ratio and the average value with each other, and make the compensation device update the compensation value in a case in which the difference is larger than the first reference value.

According to the clock generation device according to this application example, the clock generation device capable of generating the second clock signal relatively high in frequency stability with a relatively simple configuration can be realized.

APPLICATION EXAMPLE 4

In the clock generation device according to the application example described above, the compensation device may include a temperature detection section adapted to output a temperature detection signal, and the comparison section may make the temperature detection section update the temperature detection signal to be output in a case in which the difference is larger than the first reference value.

According to the clock generation device according to this application example, in the case in which, for example, the difference between the measurement result of the frequency ratio and the average value of the N measurement results of the frequency ratio is within the first reference value, by making the temperature detection section intermittently operate to update the temperature detection signal, or stopping the temperature detection section while holding the temperature detection signal, the power consumed by the temperature detection section can be reduced.

APPLICATION EXAMPLE 5

In the clock generation device according to the application example described above, an update interval of the compensation value may be controlled based on the difference.

According to the clock generation device according to this application example, since the larger the difference between the measurement result of the frequency ratio and the average value of the N measurement results of the frequency ratio is, the more rapid the change in environmental temperature is, and the smaller the difference is, the gentler the change in environmental temperature is, by appropriately controlling the update interval of the temperature compensation value of the third clock signal based on the difference, the second clock signal high in frequency stability corresponding to the frequency stability of the third clock signal can be generated while reducing the power consumed by the unnecessary update of the temperature compensation value.

APPLICATION EXAMPLE 6

In the clock generation device according to the application example described above, the clock generation device may further include a detection section, the comparison section may output a value corresponding to the difference, and the detection section may compare a number of clock pulses of the second clock signal and the output value of the comparison section with each other, and control the update interval of the compensation value based on the comparison result.

According to the clock generation device according to this application example, the clock generation device capable of generating the second clock signal relatively high in frequency stability while reducing the wasteful power consumption with a relatively simple configuration can be realized.

APPLICATION EXAMPLE 7

In the clock generation device according to the application example described above, the comparison section may output a larger value in a case in which the difference is within a second reference value smaller than the first reference value than a value output in a case in which the difference is larger than the second reference value.

According to the clock generation device according to this application example, the update interval of the temperature compensation value of the third clock can be set longer in the case in which the difference between the measurement result of the frequency ratio and the average value of the N measurement results of the frequency ratio is within the second reference value (the change in the environmental temperature is relatively gentle) than in the case in which the difference is larger than the second reference value (the change in the environmental temperature is relatively rapid). Thus, the second clock signal high in frequency stability can be generated while reducing the power consumed by the unnecessary update of the temperature compensation value.

APPLICATION EXAMPLE 8

In the clock generation device according to the application example described above, the average value is a moving average value of the N measurement results of the frequency ratio.

According to the clock generation device according to this application example, it is possible to more surely detect the change in the environmental temperature based on the difference between the measurement result of the frequency ratio and the moving average value of the N measurement results of the frequency ratio to thereby more appropriately control the update interval of the temperature compensation value of the third clock signal.

APPLICATION EXAMPLE 9

An electronic apparatus according to this application example includes the clock generation device according to any of the application examples described above.

APPLICATION EXAMPLE 10

The electronic apparatus according to the application example described above may further include a real-time clock device adapted to generate time information in sync with the second clock signal output by the clock generation device.

APPLICATION EXAMPLE 11

A moving object according to this application example includes the clock generation device according to any of the application examples described above.

APPLICATION EXAMPLE 12

A clock generation method according to this application example includes: measuring a frequency ratio between a first clock signal and a reference frequency value based on a third clock signal, generating a second clock signal obtained by masking at least one clock pulse of the first clock signal based on the measurement result of the frequency ratio, and updating a compensation value of a frequency-temperature characteristic of the third clock signal in a case in which a difference between the measurement result of the frequency ratio and an average value of N (N is a natural number) measurement results of the frequency ratio is larger than a first reference value.

BRIEF DESCRIPTION OF THE DRAWINGS

The invention will be described with reference to the accompanying drawings, wherein like numbers reference like elements.

FIG. 5 is a diagram showing an example of a relationship between measurement time, a reference value, a count value at 25 MHz, the mask number, correction time, and correction accuracy.

FIG. 12 is a diagram showing an example of a timing chart when no power supply voltage is supplied from a primary power supply.

DESCRIPTION OF EXEMPLARY EMBODIMENTS

Hereinafter, some preferred embodiments of the invention will be described in detail with reference to the accompanying drawings. It should be noted that the embodiments described below do not unreasonably limit the content of the invention as set forth in the appended claims. Further, all of the constituents described below are not necessarily essential elements of the invention.

1. CLOCK GENERATION DEVICE

1-1. First Embodiment

Figure 1:
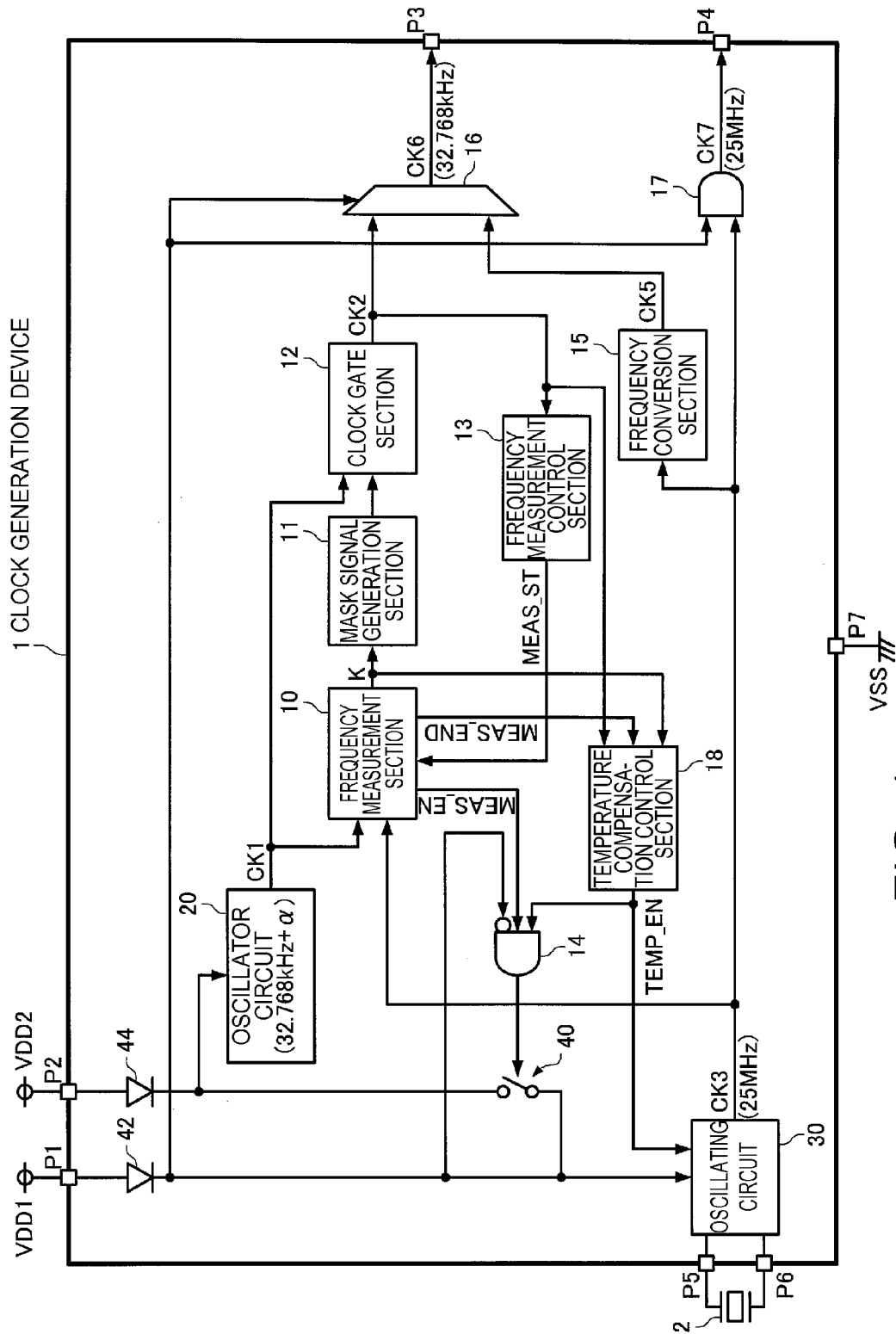
FIG. 1 shows a configuration example of a clock generation device according to an embodiment of the invention.

FIG. 1 is a diagram showing a configuration example of a clock generation device according to the first embodiment. The clock generation device 1 according to the first embodiment is configured including a frequency measurement section 10, a mask signal generation section 11, a clock gate section 12, a frequency measurement control section 13, an AND circuit 14, a frequency conversion section 15, a clock selection section 16, an AND circuit 17, a temperature compensation control section 18, an oscillator circuit 20, an oscillating circuit 30, a switch circuit 40, and diodes 42, 44, and is realized as a one-chip integrated circuit (IC). It should be noted that the clock generation device 1 according to this embodiment can have a configuration obtained by eliminating or modifying some of these constituents, or adding other constituents.

The clock generation device 1 according to the present embodiment is further provided with a power supply terminal P1 (a first power supply terminal) connected to a primary power supply and supplied with a power supply voltage VDD1 (a first power supply voltage) from the primary power supply, a power supply terminal P2 (a second power supply terminal) connected to a secondary power supply and supplied with a power supply voltage VDD2 (a second power supply voltage) from the secondary power supply, output terminals P3, P4 for respectively outputting two clock signals CK6, CK7, two terminals P5, P6 to which a crystal vibrator 2 is connected, and a ground terminal P7.

The primary power supply to be connected to the terminal P1 is an AC power supply, a high-capacity lithium-ion battery, or the like, and the power supply voltage VDD1 stops being supplied to the terminal P1 in the case in which equipment (e.g., a notebook PC and a tablet PC) including the clock generation device 1 is powered off, or in a power saving mode. In contrast, the secondary power supply to be connected to the terminal P2 is a low-capacity coin battery or the like, and the power supply voltage VDD2 is always supplied.

The oscillator circuit 20 is a circuit operating with the power supply voltage VDD2 supplied from the terminal P2 via the diode 44, and oscillating at a frequency (32.768 kHz+ α) higher than a predetermined frequency (32.768 kHz in the present embodiment). The oscillator circuit 20 is realized by, for example, a CR oscillator circuit, an LC oscillator circuit, a phase locked loop (PLL) circuit equipped with an oscillator device, or a silicon micro electro-mechanical system (MEMS). In the present embodiment, the oscillator circuit 20 always oscillates at a frequency higher than 32.768 kHz under any conditions such as a manufacturing variation, an operating temperature range, and an operating voltage range. There can be adopted, for example, a method of previously providing a large margin to the frequency on a typical condition so that the oscillator circuit 20 has a frequency higher than 32.768 kHz even in the condition in which the oscillator circuit 20 has the lowest frequency at the design phase, or a method of designing the frequency of the oscillator circuit 20 so as to be able to be adjusted, and individually adjusting the frequency of the oscillator circuit 20 at a shipping inspection so as to be certainly higher than 32.768 kHz even on the condition in which the oscillator circuit 20 has the lowest frequency in providing a certain amount of margin at the design phase.

The oscillating circuit 30 is connected between the terminal P5 and the terminal P6, operates with the power supply voltage VDD1 supplied from the terminal P1 via the diode 42, and oscillates the crystal vibrator 2 at a predetermined frequency (25 MHz in the present embodiment) to output the clock signal CK3 (a third clock signal). When the power supply voltage VDD1 stops being supplied to the terminal P1, the operation of the oscillating circuit 30 stops during the period with the switch circuit 40 kept in the OFF state, or the oscillating circuit 30 operates with the power supply voltage VDD2 supplied from the terminal P2 via the diode 44 during the period with the switch circuit 40 kept in the ON state.

Further, the oscillating circuit 30 has a temperature compensation function of the oscillation frequency of the crystal vibrator 2, and measures the temperature to update a compensation value (a temperature compensation value) of the frequency-temperature characteristic of the clock signal CK3 when a temperature measurement enable signal TEMP_EN output by the temperature compensation control section 18 described later is in a high level.

Figure 2:
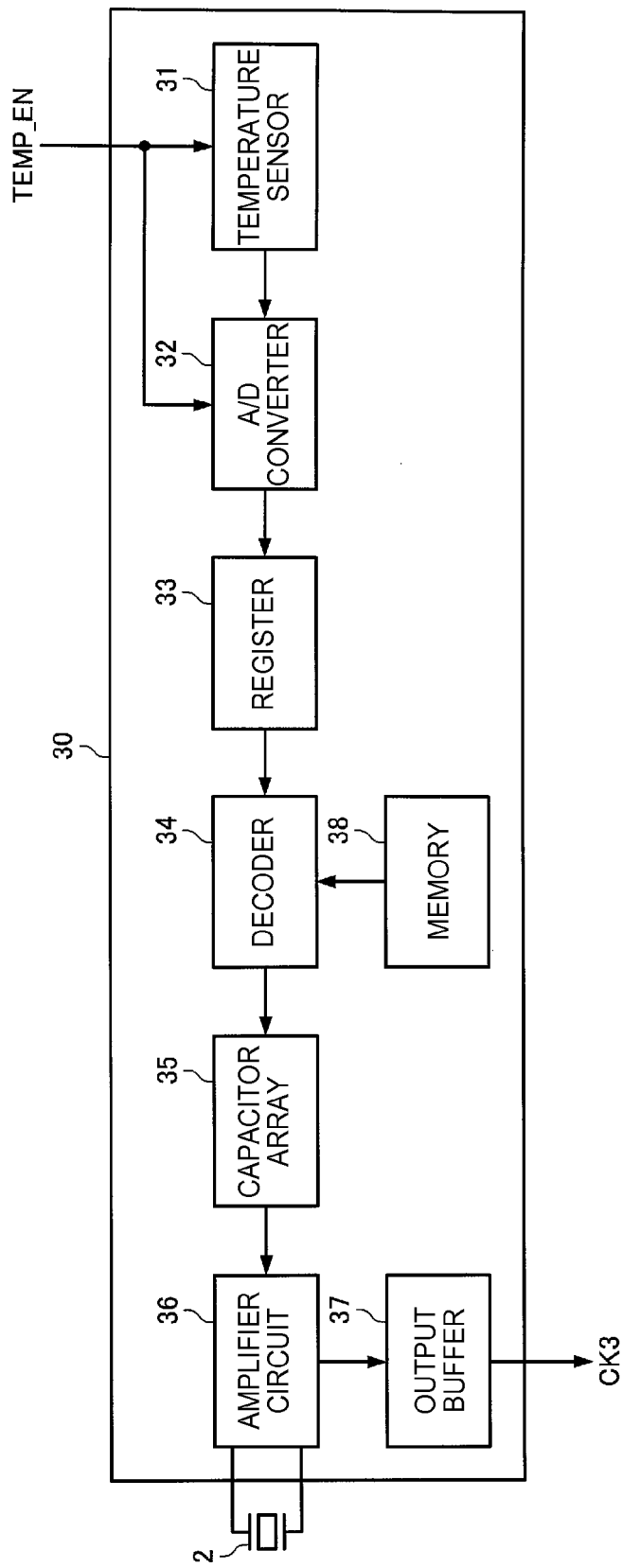
FIG. 2 is a diagram showing a configuration example of an oscillating circuit.

FIG. 2 shows a configuration example of the oscillating circuit 30 in the present embodiment. In the example shown in FIG. 2, the oscillating circuit 30 is configured including a temperature sensor 31, an A/D converter 32, a register 33, a decoder 34, a capacitor array 35, an amplifier circuit 36, an output buffer 37, and a memory 38.

When the temperature measurement enable signal TEMP_EN is in the high level, the temperature sensor 31 outputs an analog signal having a voltage value corresponding to the temperature, and the A/D converter 32 converts the output signal of the temperature sensor 31 into a digital value. The digital value of a temperature measurement result output by the A/D converter 32 is stored in the register 33. In other words, in the case in which the temperature measurement enable signal TEMP_EN is in the high level, when the temperature measurement is complete, the output value of the register 33 is updated to the digital value of the latest temperature measurement result.

In contrast, in the case in which the temperature measurement enable signal TEMP_EN is in a low level, the temperature sensor 31 and the A/D converter 32 stop the operations. Therefore, in the case in which the temperature measurement enable signal TEMP_EN is in the low level, the output value of the register 33 is not updated.

The capacitor array 35 is a load capacitance circuit of the amplifier circuit 36 for oscillating the crystal vibrator 2, constituted by a plurality of capacitance elements and a plurality of switches, and arranged to be able to variably set the load capacitance value by selecting opening and closing of the switches.

The memory 38 is a nonvolatile memory, and stores temperature compensation information for defining the correspondence relationship between the digital value of the temperature measurement result and the load capacitance value for performing the temperature compensation on the frequency-temperature characteristic of the clock signal CK3, namely the opening and closing information of each of the switches of the capacitor array 35.

The decoder 34 refers to the temperature compensation information stored in the memory 38 to output control signals of the respective switches of the capacitor array 35 corresponding to the output value of the register 33. The control signals correspond to the temperature compensation value. Every time the temperature measurement enable signal TEMP_EN is set to the high level, the output value of the register 33 is updated to the digital value of the latest temperature measurement result, and the control signals (the temperature compensation value) output by the decoder 34 are also updated in accordance with the output value.

The amplifier circuit 36 oscillates the crystal vibrator 2 using the capacitance value of the capacitor array 35, which is variably set by the decoder 34 in accordance with the temperature, as the load capacitance value. In the present embodiment, the amplifier circuit 36 oscillates the crystal vibrator 2 at 25 MHz. The oscillation signal at 25 MHz is output as the clock signal CK3 via the output buffer 37.

The clock signal CK3 at 25 MHz output by the oscillating circuit 30 higher in frequency accuracy (smaller in frequency deviation) and higher in frequency stability than the clock signal CK1 at 32.768 kHz+α output by the oscillator circuit 20. Therefore, in the present embodiment, in the frequency measurement section 10, the mask signal generation section 11, and the clock gate section 12, the frequency of 32.768 kHz+α of the clock signal CK1 is measured using the clock signal CK3, and then a clock signal CK2 at 32.768 kHz corrected in accordance with the measurement result is generated.

The frequency measurement section 10 measures a ratio between the frequency of the clock signal CK1 (a first clock signal) and the reference frequency value (32.768 kHz) based on the clock signal CK3. The measurement value is equal to a mask number of the clock pulses of the clock signal CK1 in the time (hereinafter simply referred to as "correction time") $T_{comp}$ required for a single correction. In the present embodiment, the frequency measurement section 10 starts the measurement (hereinafter referred to as "frequency ratio measurement") of the ratio between the frequency of the clock signal CK1 and the reference frequency value (32.768 kHz) when a frequency measurement start signal MEAS_ST (a pulse signal), which is output by the frequency measurement control section 13, is input.

In particular, in the present embodiment, since the frequency measurement section 10 down-counts the clock pulse number of the clock signal CK3 included in the time (measurement time $T_{meas}$) corresponding to a predetermined clock pulse number of the clock signal CK1, the count value obtained by the down-counting and the mask number of the clock pulses of the clock signal CK1 in the correction time $T_{comp}$ are equal to each other.

Figure 3:
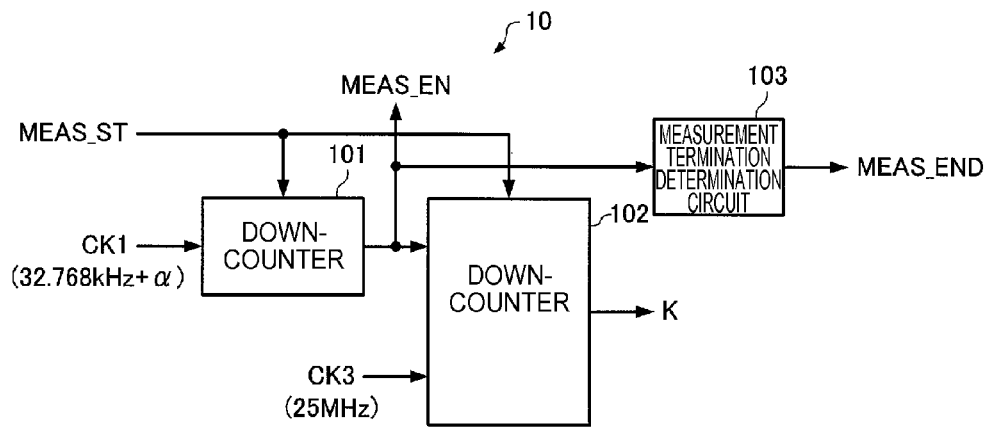
FIG. 3 is a diagram showing a configuration example of a frequency measurement section.

FIG. 3 is a diagram showing a configuration example of the frequency measurement section 10 in the present embodiment. In the example shown in FIG. 3, the frequency measurement section 10 is configured including down-counters 101, 102, and a measurement termination determination circuit 103.

The down-counter 101 outputs a low-level signal until the frequency measurement start signal MEAS_ST is supplied, then outputs a high-level signal when the frequency measurement start signal MEAS_ST is supplied, and down-counts N clock pulses of the clock signal CK1. The output of the down-counter 101 keeps the high level in a period corresponding to the N clock pulses of the clock signal CK1. The output signal of the down-counter 101 is the frequency measurement enable signal MEAS_EN representing that the measurement of the frequency ratio is in progress, and the time during which the high level is kept corresponds to the measurement time $T_{meas}$. For example, in the case of N=1,024, the measurement time $T_{meas}$ corresponds to 1,024 clock pulses of the clock signal CK1.

The down-counter 102 down-counts the clock pulse number of the clock signal CK3 input during the period in which the output signal of the down-counter 101 keeps the high level. An initial value of the down-counter 102 is a count value (=25 MHz/32.768 kHz×N) obtained by counting the period corresponding to N cycles of the clock at 32.768 kHz using the clock at 25 MHz.

When the measurement termination determination circuit 103 detects a change in the output signal of the down-counter 101 from the high level to the low level, the measurement termination determination circuit 103 generates a frequency measurement termination signal MEAS_END (a pulse signal) and then outputs the frequency measurement termination signal MEAS_END to the temperature compensation control section 18 described later.

By measuring an output signal value (an output signal value of the down-counter 102) K of the frequency measurement section 10 configured as described above, there can be obtained a value equal to the mask number of the clock pulses of the clock signal CK1 by the correction time $T_{comp}$.

Figure 4A:
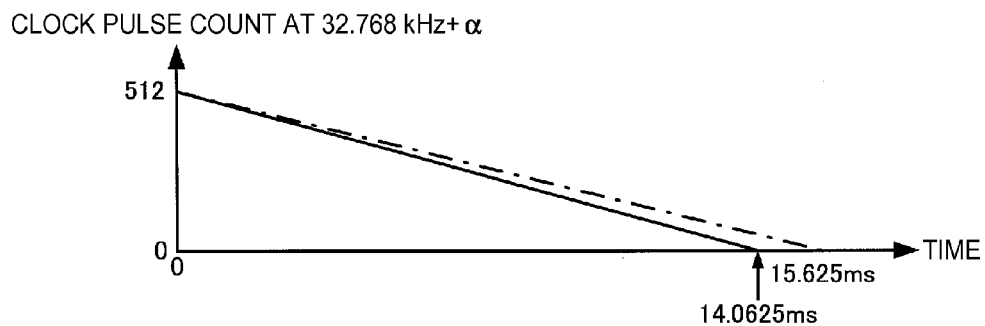
FIGS. 4A and 4B are explanatory diagrams of a relationship between an output signal value and a mask number of the frequency measurement section.

Then, a relationship between the signal value K and the mask number will be explained using FIGS. 4A and 4B. The time corresponding to 512 clock pulses of the clock at 32.768 kHz is 15.625 ms (the dashed-dotted line shown in FIG. 4A), and the time of 15.625 ms coincides with the time corresponding to 390,625 clock pulses of the clock at 25 MHz (the solid line shown in FIG. 4B). As described above, the number of 390,625 corresponds to the reference value F.

Figure 4B:
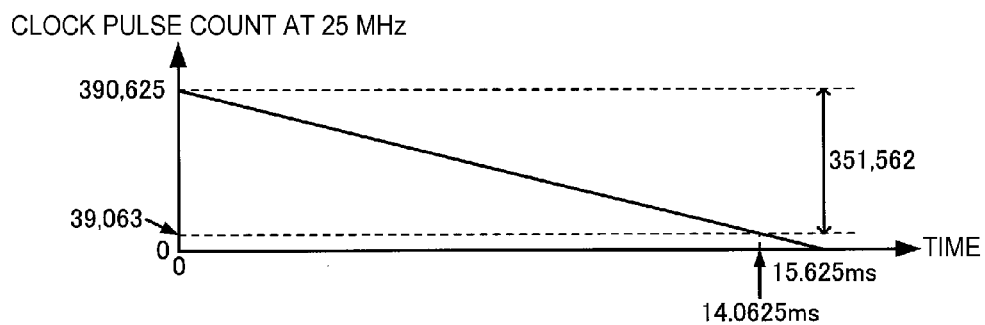

Further, in the case in which the period of the clock at 32.768 kHz+α corresponds to a value 10% shorter than the period of the clock at 32.768 kHz (α=32.768 kHz×1/9), the time (corresponding to the measurement time $T_{meas}$) corresponding to 512 clock pulses of the clock at 32.768 kHz+α is 14.0625 ms (the solid line shown in FIG. 4A), and the time of 14.0625 ms roughly coincides with the time corresponding to 351,562 clock pulses of the clock at 25 MHz (the solid line shown in FIG. 4B). The value of 351,562 corresponds to a decrement in the count value of the down-counter 102 with the initial value of 390,625 (the reference value F), and the value of the down-counter 102 after the measurement time $T_{meas}$ elapses becomes 39,063 which is a difference between the initial value 390,625 (the reference value F) of the down-counter 102 and the value of 351,562 (the decrement in the count value of the down-counter 102). The resulting value is equal to the signal value K.

On the other hand, since the period of the clock at 32.768 kHz+α is 10% shorter than the period of the clock at 32.768 kHz, in order to correct the clock at 32.768 kHz+α into the clock at 32.768 kHz, it is sufficient to mask the clock pulses corresponding to 10% of the clock at 32.768 kHz+α. Therefore, by masking 39,063 clock pulses (the signal value K) corresponding to roughly 10% of the 390,625 clock pulses (the reference value F) of the clock at 32.768 kHz+α, the correction to the clock at 32.768 kHz can be achieved. In other words, it is sufficient to mask the clock pulse of the clock signal CK1 only K times for every correction time $T_{comp}$, and the signal value K directly corresponds to the mask number.

FIG. 5 shows an example of a relationship between the measurement time $T_{meas}$, the reference value F, the count value at 25 MHz, the mask number K, the correction time $T_{comp}$, and the correction accuracy. FIG. 5 shows an example of the case in which the period of the clock at 32.768 kHz+α corresponds to a value 10% shorter (α=32.768 kHz×1/9) than the period of the clock at 32.768 kHz. For example, in the case in which the time corresponding to 64 clock pulses of the clock signal CK1 (32.768 kHz+α) is used as the measurement time $T_{meas}$ (in the case in which N of the down-counter 101 is equal to 64), the measurement time $T_{meas}$ is 1.7578125 ms, the reference value F is 48,828, the count number of the clock signal CK3 (25 MHz) is 43,945, the mask number K is 4,883, the correction time $T_{comp}$ is 1.34 second (the time corresponding to 48,828 clock pulses of the clock signal CK1), and the correction accuracy is 20.48 ppm. Further, for example, in the case in which the time corresponding to 512 clock pulses of the clock signal CK1 (32.768 kHz+α) is used as the measurement time $T_{meas}$ (in the case in which N of the down-counter 101 is equal to 512), the measurement time $T_{meas}$ is 14.6025 ms, the reference value F is 39,0625, the count number of the clock signal CK3 (25 MHz) is 351,562, the mask number K is 39,063, the correction time $T_{comp}$ is 10.73 second (the time corresponding to 390,625 clock pulses of the clock signal CK1), and the correction accuracy is 2.56 ppm. As is understood from FIG. 5, the longer the measurement time $T_{meas}$ is made, the higher the correction accuracy becomes.

Going back to FIG. 1, the mask signal generation section 11 generates the mask signal for controlling mask timing of the clock gate section 12 in accordance with the mask number (the output signal value) K calculated by the frequency measurement section 10.

The clock gate section 12 masks some of the clock pulses provided to the clock signal CK1 so as not to propagate in accordance with the mask signal generated by the mask signal generation section 11 to generate the clock signal CK2 (the second clock signal) having an average frequency of 32.768 kHz having a predetermined number of clock pulses per predetermined time.

For example, if the mask signal generation section 11 generates the mask signal set to the high level continuously or discretely for the period corresponding to K clock pulses of the clock signal CK1 in the correction time $T_{comp}$, and the clock gate section 12 is realized by a two-input AND circuit to which the clock signal CK1 and the mask signal are input, the output signal of the two-input AND circuit becomes the clock signal CK2 having an average frequency of 32.768 kHz.

When the power supply voltage VDD1 is not supplied to the terminal P1, the clock signal CK2 output by the clock gate section 12 is selected by the clock selection section 16, and is output to the outside via the terminal P3 as the clock signal CK6. Therefore, although the clock generation device 1 according to the present embodiment outputs the clock signal CK6 having a variation in clock pulse density, in the case of a timing device for measuring the time of several tens of milliseconds or several hundreds of milliseconds such as a real time clock (RTC), no major problem arises if operating with the clock signal CK6 having some density variations. It should be noted that in the case in which, for example, the correction with accuracy of 2.56 ppm is required, the correction time $T_{comp}$ becomes roughly 11 seconds as shown in FIG. 5, and if the clock pulse of the clock signal CK1 is masked continuously K times in the correction time, there can also occur the situation in which the clock pulse of the clock signal CK6 stops for about one second. In such a case, there occur problems, for example, that in an analog timepiece for driving the hand using the clock signal CK6, the hand stops for about one second, and that in a music player for playing an electronic melody using the clock signal CK6, a sound with odd rhythm is played for a moment.

Therefore, in the present embodiment, the mask signal generation section 11 generates the mask signal having the timings, at which the clock pulse of the clock signal CK1 is masked, distributed as evenly as possible in the correction time $T_{comp}$.

Figure 6:
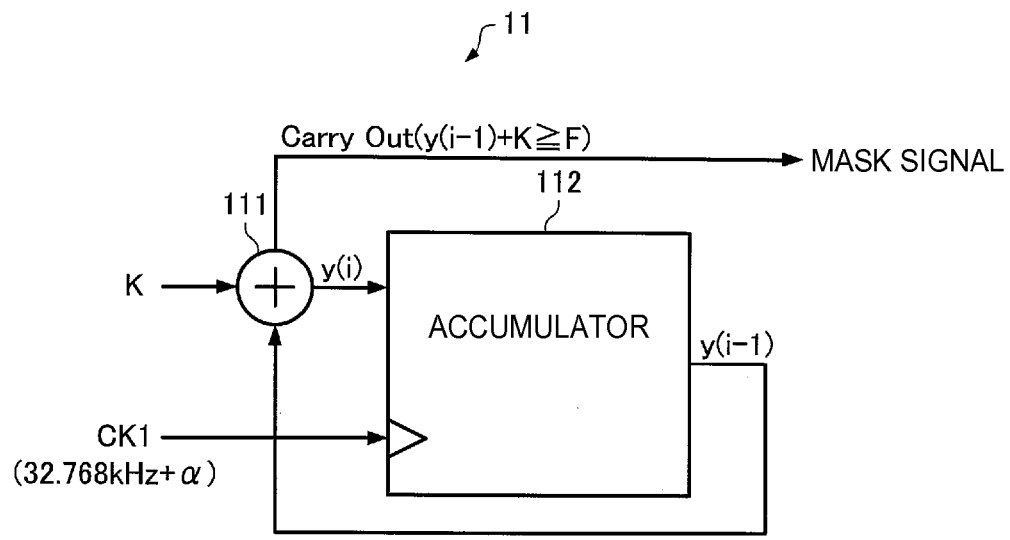
FIG. 6 is a diagram showing a configuration example of a mask signal generation section.

FIG. 6 shows a configuration example of the mask signal generation section 11 in the present embodiment. In the example shown in FIG. 6, the mask signal generation section 11 is configured including an adder circuit 111 with carry output and an accumulator 112.

The adder circuit 111 adds the mask number (the output signal value of the frequency measurement section 10) K and the output value y(i−1) of the accumulator 112 to each other and then outputs the result. It should be noted that the upper limit of the output signal value y(i) of the adder circuit 111 is F−1 (F denotes the reference value), and y(i) represents the remainder obtained by dividing (y(i−1)+K) by F as expressed below.

$y(i)=(y(i-1)+K) \bmod F$

Further, the adder circuit 111 generates and then outputs the mask signal set to the low level if $y(i-1)+K<F$ is true, and set to the high level if $y(i-1)+K \geq F$ is true. Here, the time corresponding to F clock pulses of the clock signal CK1 corresponds to the correction time $T_{comp}$, and the reference value F is set so as to correspond to the setting of the measurement time $T_{meas}$. It should be noted that the value of the reference value F and the value of N for determining the measurement time $T_{meas}$ can also be fixed in the design phase, or can also be arranged to be able to be changed by the setting of the internal register.

The accumulator 112 is a register for storing the output signal value y(i) of the adder circuit 111 in response to the input of the clock pulse of the clock signal CK1. Therefore, every time the clock pulse of the clock signal CK1 is input, the output signal value y(i−1) of the accumulator 112 is updated to the output signal value y(i) of the adder circuit 111.

Figure 7:
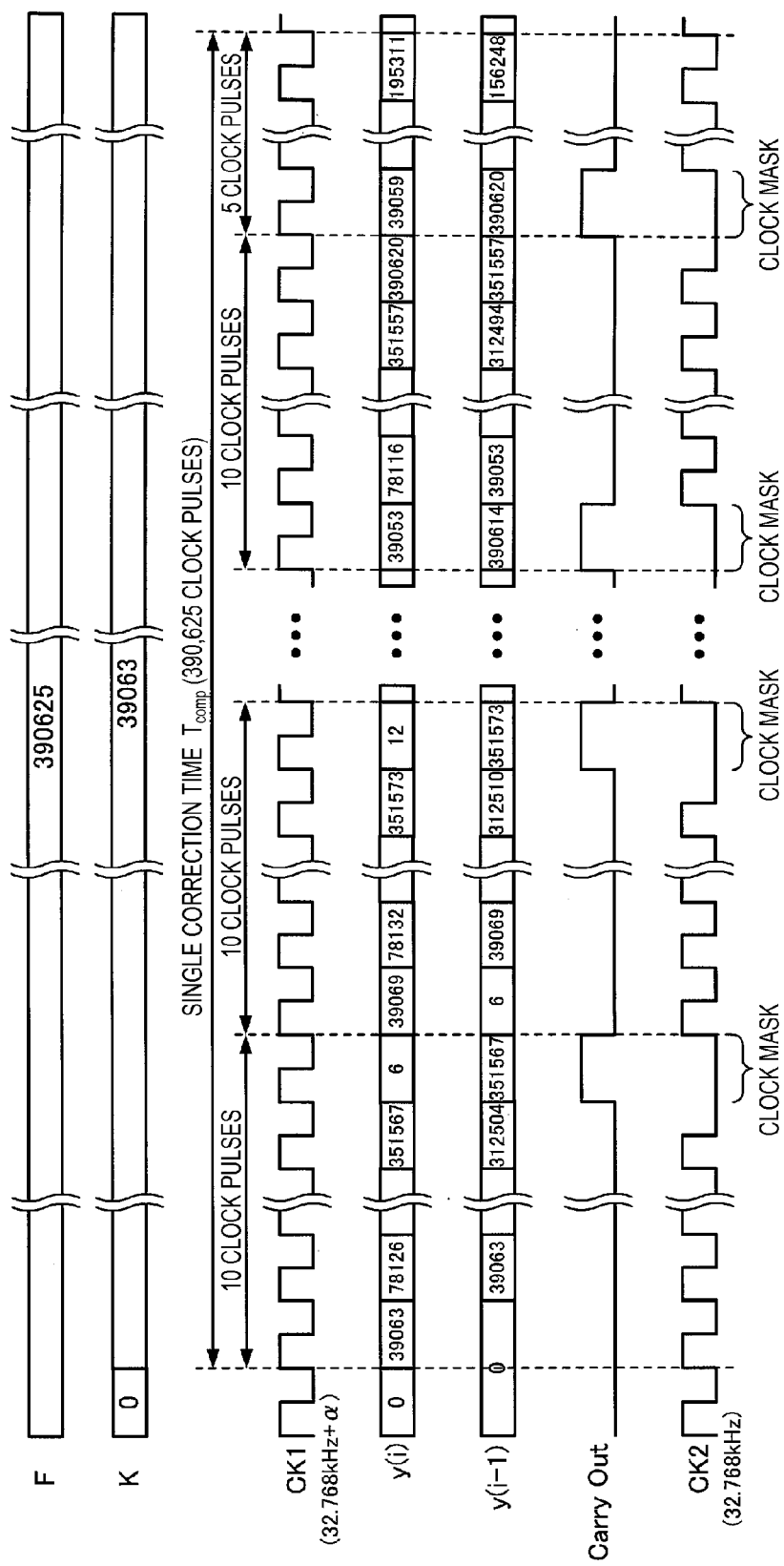
FIG. 7 is a diagram showing an example of a timing chart of an operation of the mask signal generation section.

FIG. 7 shows an example of a timing chart of an operation of the mask signal generation section 11. FIG. 7 shows an example of the case in which the period of the clock at 32.768 kHz+α corresponds to a value 10% shorter (α=32.768 kHz× 1/9) than the period of the clock at 32.768 kHz, the measurement time $T_{meas}$ is set to the time corresponding to 512 clock pulses of the clock signal CK1, and the reference value F is set to 390,625 so as to correspond to the measurement time. In other words, the correction time $T_{comp}$ corresponds to the time corresponding to 390,625 clock pulses of the clock signal CK1. Since the mask number (the output signal value of the frequency measurement section 10) K is 39,063, the 39,063 clock pulses (10%) out of the 390,625 clock pulses of the clock signal CK1 are masked in the correction time $T_{comp}$. As shown in FIG. 7, in the clock signal CK1, one clock pulse is masked in every 10 clock pulses, and it is understood that the timings of the clock pulse masking can be distributed at roughly regular intervals with the simple configuration as shown in FIG. 6.

After the clock generation device 1 according to the present embodiment completes the first correction (with the correction time $T_{comp}$), the clock generation device 1 performs the second correction with the correction time $T_{comp}$ the same as in the first correction using the K having the same value as in the first correction, and thereafter, repeats substantially the same correction in a similar manner until the frequency ratio measurement is performed next time. Further, the clock generation device 1 newly performs the frequency ratio measurement to update the signal value K when a predetermined interval time $T_{int1}$ elapses after starting the previous frequency ratio measurement.

Going back to FIG. 1, the frequency measurement control section 13 counts the number of the clock pulses of the clock signal CK2 output by the clock gate section 12 to thereby measure the interval time $T_{int1}$ and at the same time, supplies the frequency measurement section 10 with the frequency measurement start signal MEAS_ST every time the interval time $T_{int1}$ is measured.

Figure 8:
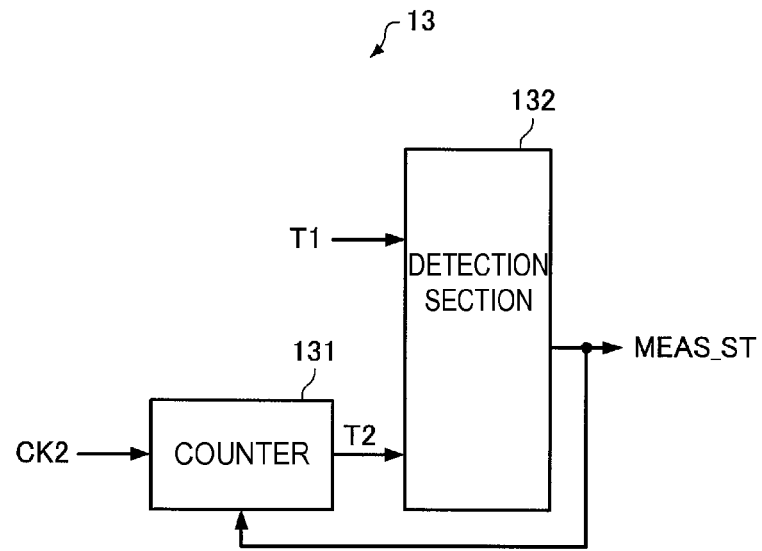
FIG. 8 is a diagram showing a configuration example of a frequency measurement control section.

FIG. 8 shows a configuration example of the frequency measurement control section 13 in the present embodiment. In the example shown in FIG. 8, the frequency measurement control section 13 is configured including a counter 131, and a detection section 132.

The counter 131 is an up-counter for counting the number of clock pulses of the clock signal CK2, and outputs a count value T2.

The detection section 132 compares a predetermined value T1 and the output value T2 of the counter 131 with each other, and then outputs the frequency measurement start signal MEAS_ST based on the comparison result. In the present embodiment, the detection section 132 outputs the frequency measurement start signal MEAS_ST set to the high level when T2=T1 (or T2≥T1) is true. Then, when the frequency measurement start signal MEAS_ST is in the high level, the counter 131 is reset to 0.

Figure 9:
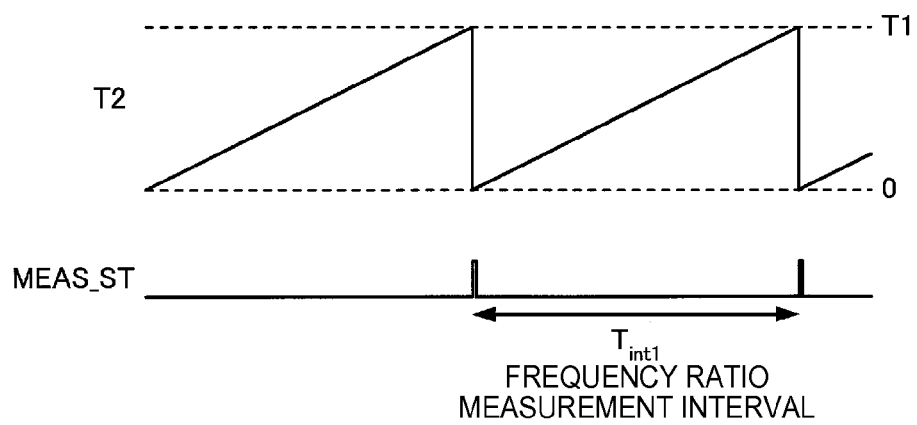
FIG. 9 is a diagram showing an example of a timing chart of an operation of the frequency measurement control section.

FIG. 9 shows an example of a timing chart of the count value T2 of the counter 131 and the frequency measurement start signal MEAS_ST. Every time the count value T2 of the counter 131 reaches the value T1, the pulse of the frequency measurement start signal MEAS_ST occurs, and the occurrence interval of the pulse is constant. As described above, since the frequency measurement start signal MEAS_ST is a signal for the frequency measurement section 10 to start the frequency ratio measurement, the occurrence interval of the pulses of the frequency measurement start signal MEAS_ST coincide with the interval time (the measurement interval of the frequency ratio) $T_{int1}$. In other words, the frequency measurement section intermittently performs the frequency ratio in every constant interval time $T_{int1}$.

It should be noted that the value (in reality, the value of T1 for determining the $T_{int1}$) of the interval time $T_{int1}$ is arbitrarily selected taking the environmental condition and the allowable range of the frequency correction error into consideration, and can also be fixed in the design phase, or can also be arranged to be able to be changed by the setting of the internal register, the setting of the nonvolatile memory, or the like.

Going back to FIG. 1, the temperature compensation control section 18 generates the temperature measurement enable signal TEMP_EN taking the high level for a certain period of time basically every time a certain interval time $T_{int2}$ elapses. The period of time during which the temperature measurement enable signal TEMP_EN is kept in the high level is set to be equal to or longer than the time necessary for the temperature sensor 31 and the A/D converter 32 of the oscillating circuit 30 to take from when starting the temperature measurement to when completing the temperature measurement. The interval time $T_{int2}$ is set to a relatively long period of time, for example, a period of time in the order of several seconds through several tens of seconds assuming that the temperature change is basically gentle. By elongating the interval time $T_{int2}$ it is possible to reduce the current consumed in the temperature sensor 31 and the A/D converter 32. However, in the case in which the temperature changes rapidly, rapid deterioration of the frequency accuracy might occur unless the load capacitance value of the oscillating circuit 30 is promptly updated. Therefore, in the present embodiment, using the fact that the mask number K changes in accordance with the temperature change, the temperature compensation control section 18 forcibly and promptly sets the temperature measurement enable signal TEMP_EN to the high level in the case in which the mask number K has changed rapidly.

Figure 10:
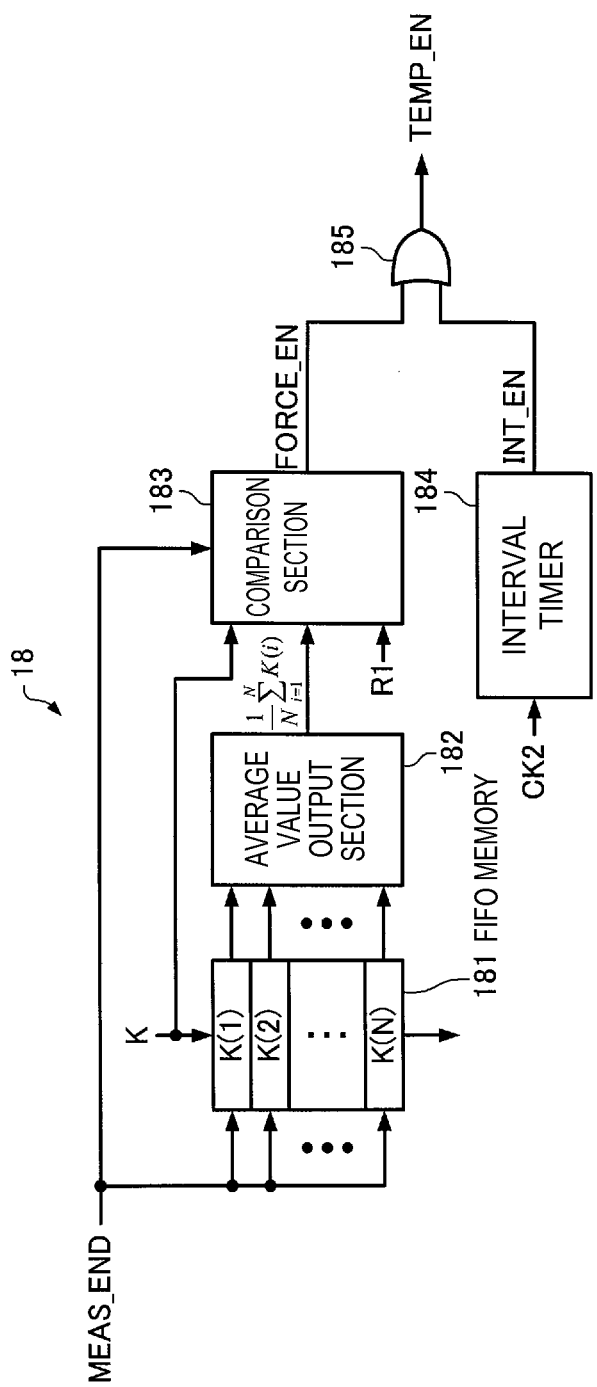
FIG. 10 is a diagram showing a configuration example of a temperature compensation control section in a first embodiment of the invention.

FIG. 10 shows a configuration example of the temperature compensation control section 18 in the present embodiment. In the example shown in FIG. 10, the temperature compensation control section 18 is configured including a FIFO (First-In First-Out) memory 181, an average value output section 182, a comparison section 183, an interval timer 184, and an OR circuit 185.

The FIFO memory 181 is for sequentially storing N (N denotes a natural number) mask numbers (the output signal values of the frequency measurement section 10) K (K(1) through K(N)). The FIFO memory 181 moves each of the values K(i) to K (i+1) (i=1 through N−1), and then stores the latest mask number K as K(1) every time the frequency measurement termination signal MEAS_END is input from the frequency measurement section 10. On this occasion, K(N) is removed (deleted) from the FIFO memory 181.

The comparison section 183 calculates the difference (an absolute value of the difference) between the latest mask number K and the average value (the moving average value) of the N mask numbers K, then compares the difference and a first reference value R1 with each other when the frequency measurement termination signal MEAS_END is input, and then sets a forced enable signal FORCE_EN to the high level in accordance with the comparison result. The first reference value R1 is a threshold value for determining whether or not the forced enable signal FORCE_EN should be set to the high level, and can also be fixed in the design phase, or can also be arranged to be able to be changed by the setting of the internal register, the setting of the nonvolatile memory, or the like. In the present embodiment, the comparison section 183 fixes the forced enable signal FORCE_EN to the low level if the difference between the latest mask number K and the average value (the moving average value) of the N mask numbers K is within R1, or sets the forced enable signal FORCE_EN to the high level for a certain period of time if the difference is larger than R1.

It should be noted that in the case of N=1, the average value output section 182 directly outputs the mask number K(1) stored in the FIFO memory 181, and the comparison section 183 calculates the difference between the latest mask number K and the previous mask number K(1), and then compares the difference and the first reference value R1 with each other when the frequency measurement termination signal MEAS_END is input.

The interval timer 184 outputs an intermittent enable signal INT_EN set to the high level for a certain period of time every time a predetermined number of clock pulses of the clock signal CK2 are counted.

The OR circuit 185 is a circuit for outputting a voltage level representing the logical sum of a voltage level of the forced enable signal FORCE_EN and a voltage level of the intermittent enable signal INT_EN, and the output signal of the OR circuit 185 corresponds to the temperature measurement enable signal TEMP_EN. Specifically, when both of the forced enable signal FORCE_EN and the intermittent enable signal INT_EN are in the low level, the temperature measurement enable signal TEMP_EN is in the low level, when either one or both of the forced enable signal FORCE_EN and the intermittent enable signal INT_EN is (are) in the high level, the temperature measurement enable signal TEMP_EN is in the high level.

Figures 11A, 11B, 11C:
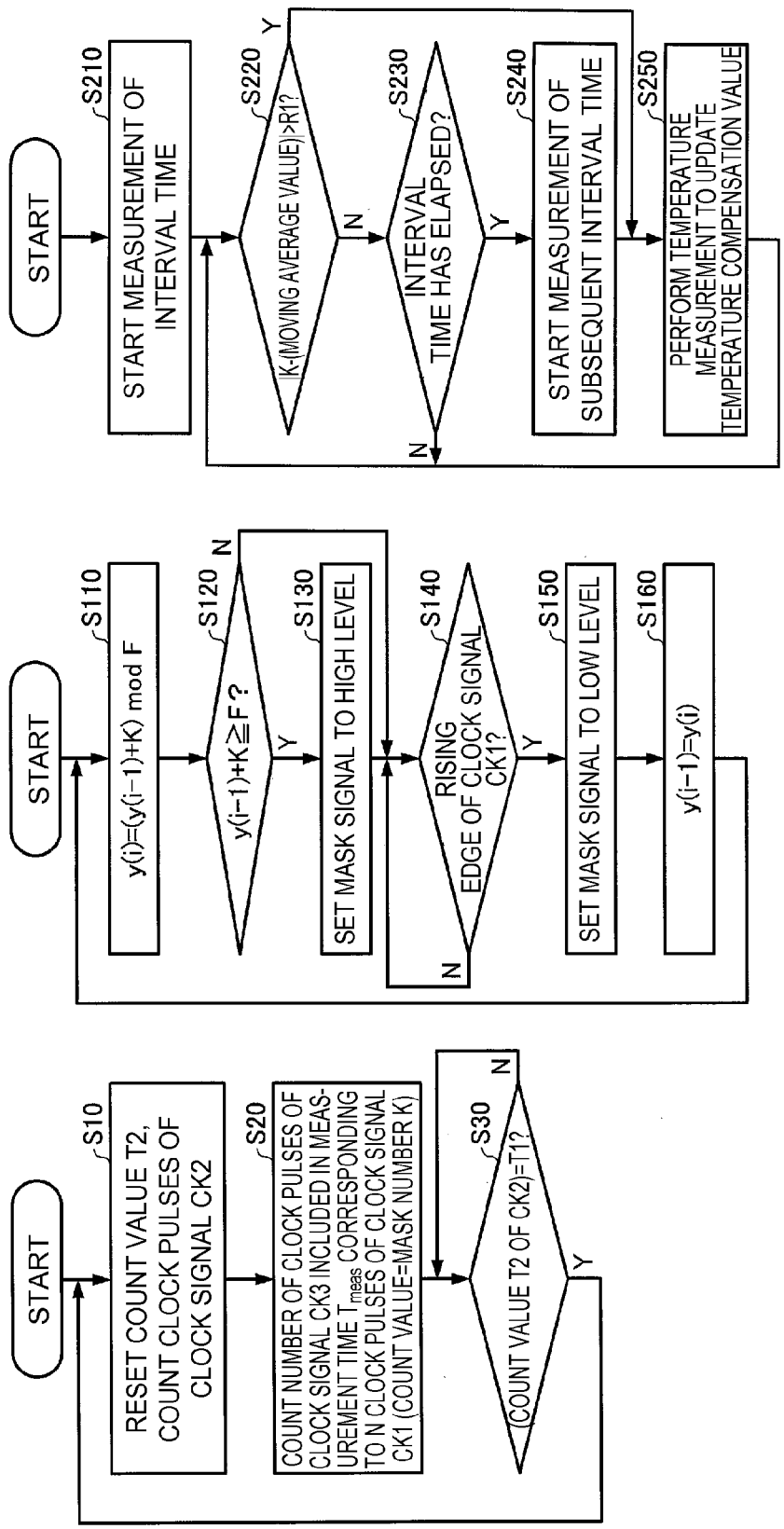
FIGS. 11A and 11B are each a flowchart showing a generation process of a mask signal.
FIG. 11C is a flowchart showing an updating process of a temperature compensation value in the first embodiment.

FIGS. 11A and 11B are flowcharts showing the generation process of the mask signal explained hereinabove. FIG. 11A is a flowchart of the frequency ratio measurement, and FIG. 11B is a flowchart of the frequency correction. Further, FIG. 11C is a flowchart showing the updating process of the temperature compensation value explained hereinabove. The frequency ratio measurement, the frequency correction, and the update of the temperature compensation value are performed in parallel to each other.

In the flowchart of the frequency ratio measurement shown in FIG. 11A, the clock generation device 1 first resets the count value T2 to count the number of the clock pulses of the clock signal CK2 (S10).

Then, the clock generation device 1 counts the number of the clock pulses of the clock signal CK3 included in the measurement time $T_{meas}$ corresponding to N clock pulses of the clock signal CK1 (S20). The count value obtained here is equal to the mask number K.

Then, the clock generation device 1 repeatedly performs the processes of the steps S10 and S20 every time (Y in the step S30) the count value T2 of the number of clock pulses of the clock signal CK2 coincides with the predetermined value T1 (i.e., the interval time $T_{int1}$ elapses).

In the flowchart of the frequency correction shown in FIG. 11B, the clock generation device 1 first calculates the following formula using the output value y(i−1) of the accumulator 112, the mask number K (the latest mask number K obtained in the step S20 shown in FIG. 11A), and the reference value F (S110).

$y(i)=(y(i-1)+K)\bmod F$

Then, if y(i−1)+K≥F is true (Y in the step S120), the clock generation device 1 sets the mask signal to the high level (S130), then sets the mask signal to the low level (S150) at the timing (Y in the step S140) of the subsequent rising edge of the clock signal CK1, and then updates (S160) the output value y(i−1) of the accumulator 112 to y(i).

In contrast, if y(i−1)+K<F is true (N in the step S120), the clock generation device 1 keeps the mask signal in the low level (S150) at the timing (Y in the step S140) of the subsequent rising edge of the clock signal CK1, and then updates (S160) the output value y(i−1) of the accumulator 112 to y(i).

Further, the clock generation device 1 repeatedly performs the processes of the steps S110 through S160 using the latest mask number K obtained in the step S20 shown in FIG. 11A.

In the flowchart of the updating process of the temperature compensation value shown in FIG. 11C, the clock generation device 1 first starts the measurement of the interval time $T_{int2}$ (S210).

Then, in the case in which the difference (the absolute value of the difference) between the mask number K obtained in the step S20 shown in FIG. 11A and the average value (the moving average value) of the last N mask numbers K is larger than the first reference value R1 (Y in the step S220), the clock generation device 1 sets the temperature measurement enable signal TEMP_EN to the high level only for a certain period of time to perform the temperature measurement, and then updates (S250) the temperature compensation value.

Further, in the case in which the interval time $T_{int2}$ has elapsed (Y in the step S230), the clock generation device 1 starts the measurement of the subsequent interval time $T_{int2}$ (S240), and then sets the temperature measurement enable signal TEMP_EN to the high level for a certain period of time to perform the temperature measurement to update (S250) the temperature compensation value.

Going back to FIG. 1, the frequency measurement enable signal MEAS_EN and the temperature measurement enable signal TEMP_EN is supplied respectively to two non-inverting inputs of the three input AND circuit 14, and the inverting input of the AND circuit 14 is supplied with the voltage of the terminal P1 via the diode 42. Therefore, the AND circuit 14 always outputs a low level signal during the period in which the terminal P1 is supplied with the power supply voltage VDD1, and in the period in which the terminal P1 is not supplied with the power supply voltage VDD1, the AND circuit outputs a high level signal during the period in which either one of both of the frequency measurement enable signal MEAS_EN and the temperature measurement enable signal TEMP_EN is (are) in the high level, or outputs a low level signal during the period in which both of the frequency measurement enable signal MEAS_EN and the temperature measurement enable signal TEMP_EN are in the low level.

The output signal of the AND circuit 14 is supplied to a control input of the switch circuit 40, and the switch circuit 40 is set to the ON state (electrically connects the two terminals to each other) if the output signal of the AND circuit 14 is in the high level, or is set to the OFF state (electrically isolates the two terminals from each other) if the output signal is in the low level.

Therefore, in the case in which the terminal P1 is supplied with the power supply voltage VDD1, since the switch circuit 40 is always set to the OFF state, the oscillating circuit 30 is not supplied with the power supply voltage VDD2, but is only supplied with the power supply voltage VDD1 to output the clock signal CK3. In contrast, in the case in which the terminal P1 is not supplied with the power supply voltage VDD1, the power supply voltage VDD2 is supplied to the oscillating circuit 30 only in the period (in which the frequency measurement enable signal MEAS_EN is in the high level) in which the frequency measurement section 10 performs the frequency ratio measurement, and the period (in which the temperature measurement enable signal TEMP_EN is in the high level) in which the oscillating circuit 30 performs the temperature measurement, and thus the clock signal CK3 is output.

When the power supply voltage VDD1 is supplied to the terminal P1, the clock signal CK3 is transmitted through the AND circuit 17, and is output to the outside via the terminal P4 as a clock signal CK7. On the other hand, when the power supply voltage VDD1 is not supplied to the terminal P1, the clock signal CK3 generated in the measurement period of the frequency ratio by the frequency measurement section 10 and the measurement period of the temperature by the oscillating circuit 30 is masked in the AND circuit 17, but is not output to the outside. FIG. 12 shows an example of a timing chart when the terminal P1 is not supplied with the power supply voltage VDD1. It should be noted that in the example shown in FIG. 12, the period of the temperature measurement performed intermittently partially overlap the measurement period of the frequency ratio, and the period of the temperature measurement forcibly performed begins at the point of (after the mask number K is updated) the termination of the measurement period of the frequency ratio.

The frequency conversion section 15 performs the frequency conversion on the clock signal CK3 during the period in which the terminal P1 is supplied with the power supply voltage VDD1 to generate a clock signal CK5 having the average frequency equal to a predetermined frequency (32.768 kHz in the present embodiment).

The frequency conversion section 15 can also be arranged to divide the frequency of the clock signal CK3 while switching between a plurality of frequency division ratios using a frequency divider circuit having a variable frequency division ratio to thereby generate the clock signal having the average frequency of 32.768 kHz. For example, by sequentially repeating the frequency division by 763 on the clock signal CK3 481 times, and the frequency division by 762 on the clock signal CK3 31 times, the clock signal CK5 having the average frequency of 32.768 kHz can be obtained.

Figure 13:
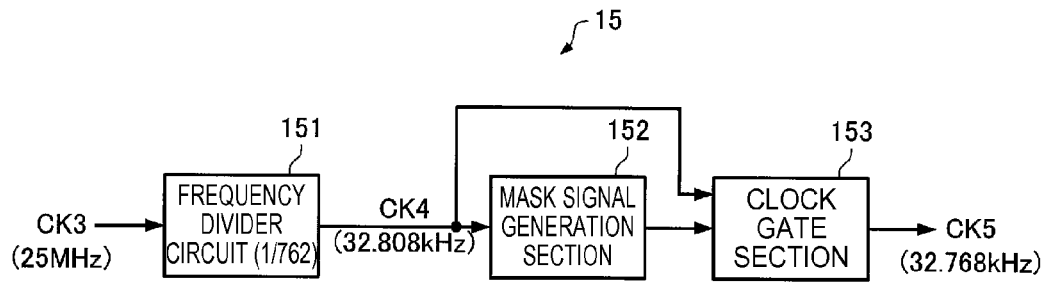
FIG. 13 is a diagram showing a configuration example of a frequency conversion section.

Alternatively, the frequency conversion section 15 can also be provided with such a configuration as shown in FIG. 13. In the example shown in FIG. 13, the frequency conversion section 15 is configured including a frequency divider circuit 151, a mask signal generation section 152, and a clock gate section 153. The clock signal CK3 (the third clock signal) is input to the frequency divider circuit 151, and the frequency divider circuit 151 divides the frequency of the clock signal CK3 at a predetermined frequency division ratio to generate a clock signal CK4 having a frequency higher than 32.768 kHz. In the present embodiment, the frequency divider 151 performs the frequency division by 762 on the clock signal CK3 to generate the clock signal CK4 at 32.808 kHz (=25 MHz/762).

The mask signal generation section 152 generates the mask signal for controlling the mask timing of the clock gate section 153 based on the information of a predetermined mask number per predetermined clock pulse number of the clock signal CK4.

The clock gate section 153 masks some of the clock pulses provided to the output clock signal CK4 of the frequency divider circuit 151 so as not to propagate in accordance with the mask signal generated by the mask signal generation section 152 to generate the clock signal CK5 having an average frequency of 32.768 kHz.

For example, the number of clock pulses of the clock at 32.768 kHz included in a period of time corresponding to 390,625 clock pulses of the clock at 32.808 kHz is 390,144, and the difference is 481. Therefore, it is possible that, for example, the mask signal generation section 152 generates the mask signal for masking the 481 clock pulses per 390,625 clock pulses of the clock signal CK4, and the clock gate section 153 is realized with a two-input AND circuit to which the clock signal CK4 and the mask signal are input.

Figure 14:
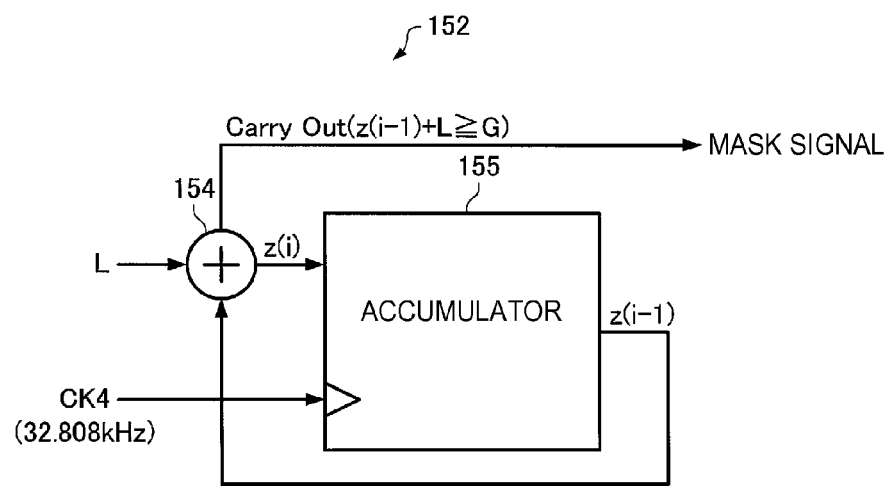
FIG. 14 is a diagram showing a configuration example of a mask signal generation section.

In the present embodiment, the mask signal generation section 152 generates the mask signal having the timings, at which the clock pulse of the clock signal CK4 is masked, distributed as evenly as possible similarly to the mask signal generation section 11. FIG. 14 shows a configuration example of the mask signal generation section 152 in the present embodiment. In the example shown in FIG. 14, the mask signal generation section 152 is configured including an adder circuit 154 with carry output and an accumulator 155.

The adder circuit 154 adds a predetermined value L and the output value $z(i-1)$ of the accumulator 155 to each other and then outputs the result. It should be noted that the upper limit of the output signal value $z(i)$ of the adder circuit 154 is G−1, and $z(i)$ represents the remainder obtained by dividing $(z(i-1)+L)$ by G as expressed below.

$$z(i)=(z(i-1)+L)\bmod G$$

Further, the adder circuit 154 generates and then outputs the mask signal set to the low level if $z(i-1)+L \geq G$ is true, and set to the high level if $z(i-1)+L \geq G$ is true. Here, for example, the predetermined value L is a mask number per G clock pulses of the clock signal CK4, and is 481 assuming that G is equal to 390,625. It should be noted that the value of L and the value of G can also be fixed in the design phase, or can also be arranged to be able to be changed by the setting of the internal register.

The accumulator 155 is a register for storing the output signal value $z(i)$ of the adder circuit 154 in response to the input of the clock pulse of the frequency-divided clock signal CK4. Therefore, every time the clock pulse of the frequency-divided clock signal CK4 is input, the output signal value $z(i-1)$ of the accumulator 155 is updated to the output signal value $z(i)$ of the adder circuit 154.

Figure 15:
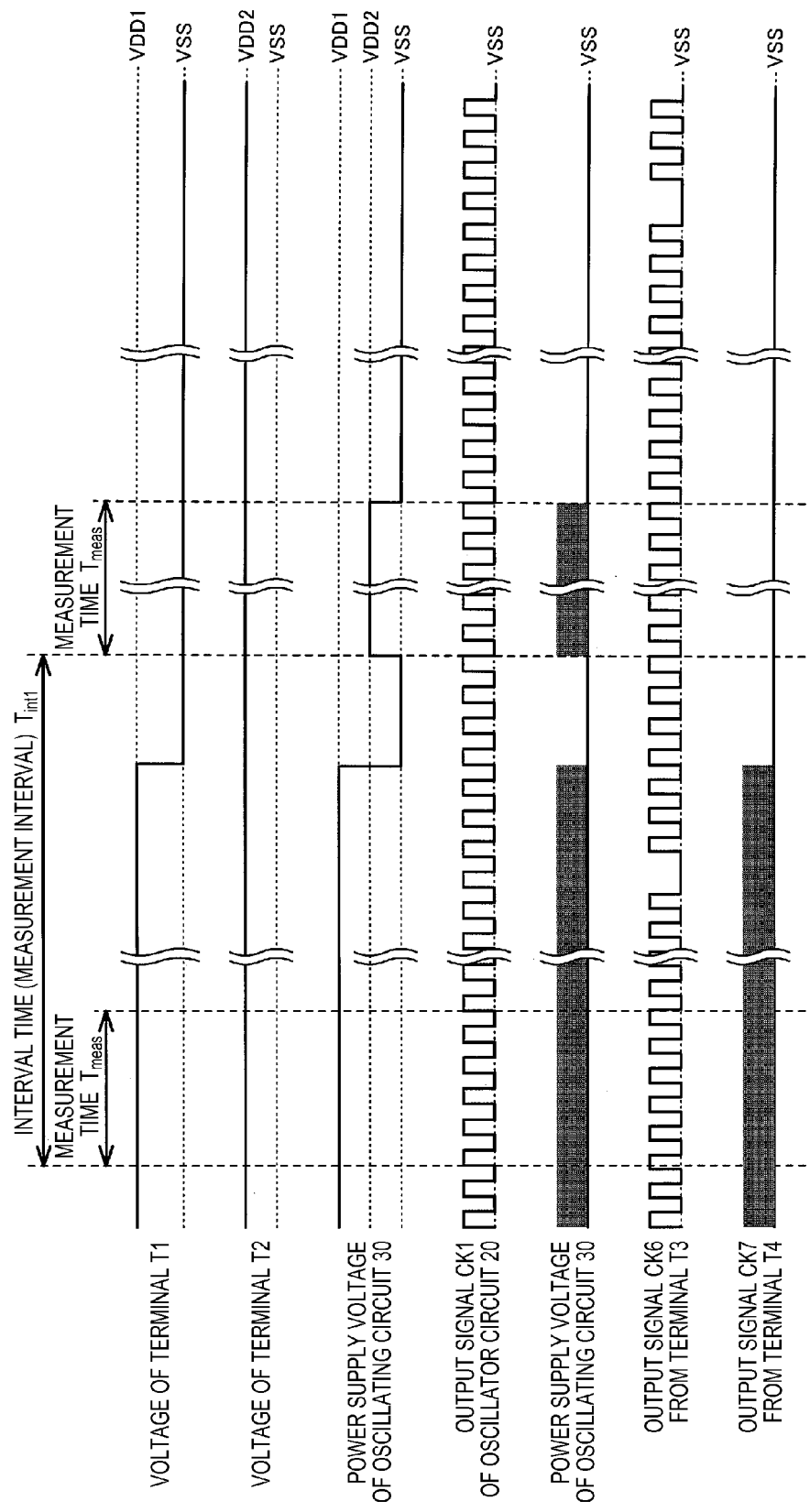
FIG. 15 is a diagram showing an example of a timing chart around the timing when the supply of the power supply voltage from the primary power supply stops.

In the clock generation device 1 according to the present embodiment, when the power supply voltage VDD1 is supplied to the terminal P1, the clock signal CK5 output by the clock gate section 153 is selected by the clock selection section 16, and is output to the outside via the terminal P3 as the clock signal CK6. Further, as explained above, when the power supply voltage VDD1 is not supplied to the terminal P1, the clock signal CK2 output by the clock gate section 12 is selected by the clock selection section 16, and is output to the outside via the terminal P3 as the clock signal CK6. FIG. 15 shows an example of a timing chart of the operation of the clock generation device 1 around the point when the supply of the power supply voltage VDD1 to the terminal P1 stops. It should be noted that in the present embodiment, since the supply of the power supply voltage VDD1 from the primary power supply can stop at any time, the oscillation operation of the oscillator circuit 20 is always continued, and the frequency ratio measurement of the clock signal CK1 by the frequency measurement section 10 is intermittently performed also during the period in which the power supply voltage VDD1 is supplied.

As explained hereinabove, according to the clock generation device according to the first embodiment, by masking some of the clock pulses of the clock signal CK1 having a frequency higher than 32.768 kHz, the clock signal CK2 having the average frequency of 32.768 kHz can be generated while eliminating or simplifying the frequency adjustment of the oscillator circuit 20. Further, according to the clock generation device according to the first embodiment, when the change in the environmental temperature is rapid, since the difference between the mask number K and the moving average value of the N mask numbers K becomes larger than the first reference value R1, the temperature measurement is forcibly performed to update the temperature compensation value of the clock signal CK3. Further, when the change in the environmental temperature is gentle, since the difference becomes within the first reference value R1, the temperature measurement is performed intermittently every interval time $T_{int2}$ to update the temperature compensation value. Therefore, the frequency stability of the clock signal CK3 can be maintained. As described above, according to the clock generation device according to the first embodiment, since the temperature compensation value of the clock signal CK3 is forcibly updated when the variation in the environmental temperature is rapid, the cycle at which the temperature compensation of the clock signal CK3 is intermittently performed can be set to be relatively long. Therefore, it is possible to generate the clock signal CK2 with high frequency stability in accordance with the frequency stability of the clock signal CK3 while reducing the power consumed by the unnecessary temperature measurement.

Further, according to the clock generation device according to the first embodiment, since the mask number K for generating the clock signal CK2 is also used for the updating control of the temperature compensation value of the clock signal CK3, the size of the clock generation device can be made smaller.

Further, according to the clock generation device according to the first embodiment, by counting the number of clock pulses of the clock signal CK3 included in the time period corresponding to a predetermined number of clock pulses of the clock signal CK1, the mask number K of the clock signal CK1 can directly be calculated with a simple configuration, and at the same time, by using the clock signal CK3 sufficiently higher in frequency than the clock signal CK1, the desired correction accuracy can be achieved while reducing the measurement time.

Further, according to the clock generation device according to the first embodiment, by configuring the mask signal generation section 11 using the adder circuit 111 and the accumulator 112, the mask signal generation section 11 can generate the clock signal CK2 having the timings, at which the clock pulse of the clock signal CK1 is masked, distributed as evenly as possible with the simple configuration.

Further, according to the clock generation device according to the first embodiment, since the clock signal CK5 directly generated from the clock signal CK3 is selected and output when the power supply voltage VDD1 is supplied to the terminal P1, the clock signal at 32.768 kHz higher in frequency accuracy than the clock signal CK2 can be output. On the other hand, even when the power supply voltage VDD1 is not supplied to the terminal P1, it is possible to select the clock signal CK2 generated from the clock signal CK1 to output the clock signal at 32.768 kHz using the power supply voltage VDD2 always supplied to the terminal P2 as the power supply voltage.

Further, according to the clock generation device according to the first embodiment, by configuring the mask signal generation section 152 using the adder circuit 154 and the accumulator 155, the mask signal generation section 152 can generate the clock signal CK5 having the timings, at which the clock pulse of the clock signal CK4 is masked, distributed as evenly as possible with the simple configuration.

Further, according to the clock generation device according to the first embodiment, since the frequency of the clock signal CK1 is intermittently measured providing the power supply voltage VDD2 is supplied, whenever the supply of the power supply voltage VDD1 stops, the clock signal CK2 obtained by appropriately performing the frequency correction on the clock signal CK1 can promptly be generated using the most recent measurement result. Further, since the frequency of the clock signal CK1 is intermittently measured even after the supply of the power supply voltage VDD1 stops, it is possible to reduce the influence of the frequency variation of the clock signal CK1 caused by the environmental change to continue to generate the clock signal CK2 having a roughly constant frequency while reducing the power consumption.

1-2. Second Embodiment

Although in the clock generation device 1 according to the first embodiment, it is arranged that in the case in which the mask number K has rapidly changed, the temperature measurement is forcibly performed to update the temperature compensation value assuming that the temperature has changed rapidly, the measurement intervals (the interval time $T_{int2}$) of the temperature measurement performed forcibly are constant. Therefore, in the environment in which the temperature change is not rapid but relatively high, there is a possibility that the temperature compensation fails to be made in time, and thus, the frequency-temperature characteristic of the clock signal CK3 is deteriorated depending on the setting of the interval time $T_{int2}$. On the other hand, in the environment in which the temperature change hardly occurs or is gentle, there is no need to update the temperature compensation value so frequently. However, depending on the setting of the interval time $T_{int2}$, there is a possibility that the temperature measurement is performed at intervals shorter than necessary to consume a wasteful current. Therefore, in the clock generation device 1 according to a second embodiment of the invention, the temperature compensation control section 18 forcibly performs the temperature measurement to update the temperature compensation value similarly to the first embodiment in the case in which the difference between the mask number K and the moving average value of the mask numbers K obtained by performing the measurement N times is larger than the first reference value R1, or switches the length of the interval time $T_{int2}$ using a second reference value R2(<R1) as a threshold value in the case in which the difference is within the first reference value R1.

Figure 16:
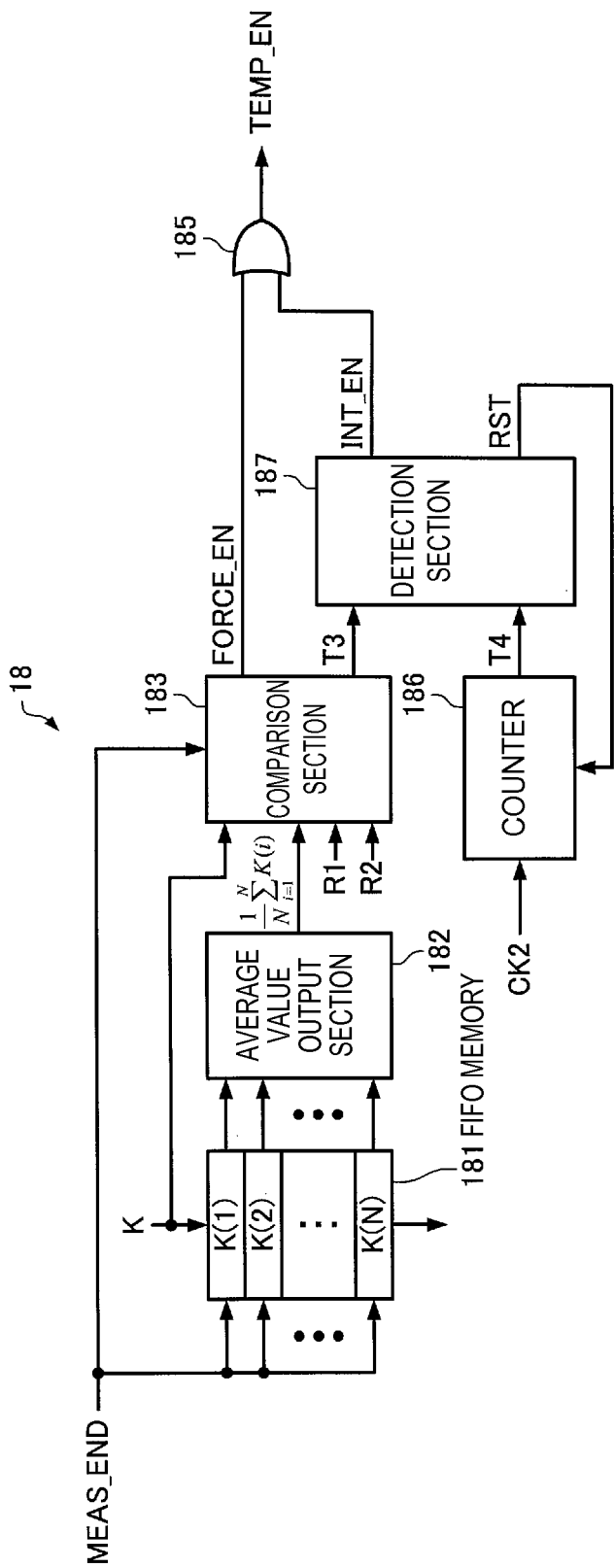
FIG. 16 is a diagram showing a configuration example of a temperature compensation control section in a second embodiment of the invention.

FIG. 16 shows a configuration example of the temperature compensation control section 18 in the second embodiment. In FIG. 16, the same constituents as those shown in FIG. 10 are denoted with the same symbols. In the example shown in FIG. 16, the temperature compensation control section 18 is configured including a FIFO (First-In First-Out) memory 181, an average value output section 182, a comparison section 183, an OR circuit 185, a counter 186, and a detection section 187.

Since the configurations and the functions of the FIFO memory 181 and the average value output section 182 are the same as those shown in FIG. 10, the explanation thereof will be omitted.

The comparison section 183 calculates the difference (an absolute value of the difference) between the latest mask number K and the average value (the moving average value) of the N mask numbers K, then compares the difference and the first reference value R1 with each other when the frequency measurement termination signal MEAS_END is input, and then sets a forced enable signal FORCE_EN to the high level in accordance with the comparison result. The first reference value R1 is a threshold value for determining whether or not the forced enable signal FORCE_EN should be set to the high level, and can also be fixed in the design phase, or can also be arranged to be able to be changed by the setting of the internal register or the like. In the present embodiment, the comparison section 183 fixes the forced enable signal FORCE_EN to the low level if the difference between the latest mask number K and the average value (the moving average value) of the N mask numbers K is within R1, or sets the forced enable signal FORCE_EN to the high level for a certain period of time if the difference is larger than R1.

Further, the comparison section 183 compares the difference (the absolute value of the difference) between the latest mask number K and the average value (the moving average value) of the N mask numbers K with the second reference value R2 when the frequency measurement termination signal MEAS_END is input, and then outputs a value T3 corresponding to the comparison result. The second reference value R2 is a threshold value for switching the value of T3, and can also be fixed in the design phase, or can also be arranged to be able to be changed by the setting of the internal register or the like. In the present embodiment, the second reference value R2 is smaller than the first reference value R1, and the comparison section 183 outputs the value T3=A(>B) if the difference between the latest mask number K and the average value (the moving average value) of the N mask numbers K is within the second reference value R2, or the value T3=B(<A) if the difference is larger than the second reference value R2.

It should be noted that in the case of N=1, the average value output section 182 directly outputs the mask number K(1) stored in the FIFO memory 181, and the comparison section 183 calculates the difference between the latest mask number K and the previous mask number K(1), and then compares the difference with the first reference value R1 and the second reference value R2 when the frequency measurement termination signal MEAS_END is input.

The counter 186 is an up-counter for counting the number of clock pulses of the clock signal CK2, and outputs a count value T4.

The detection section 187 compares the output value T3 of the comparison section 183 and the output value T4 of the counter 186 with each other, and then outputs the intermittent enable signal INT_EN set to the high level for a certain period of time and a reset signal RST based on the comparison result. In the present embodiment, the detection section 187 outputs the intermittent enable signal INT_EN set to the high level for the certain period of time from when T4=T3 (or T4≥T3) is true. Further, the detection section 187 outputs the reset signal RST set to the high level when T4=T3 (or T4≥T3) is true. When the reset signal RST is in the high level, the counter 186 is reset to 0.

The OR circuit 185 is a circuit for outputting a voltage level representing the logical sum of a voltage level of the forced enable signal FORCE_EN and a voltage level of the intermittent enable signal INT_EN, and the output signal of the OR circuit 185 corresponds to the temperature measurement enable signal TEMP_EN.

Figure 17A:
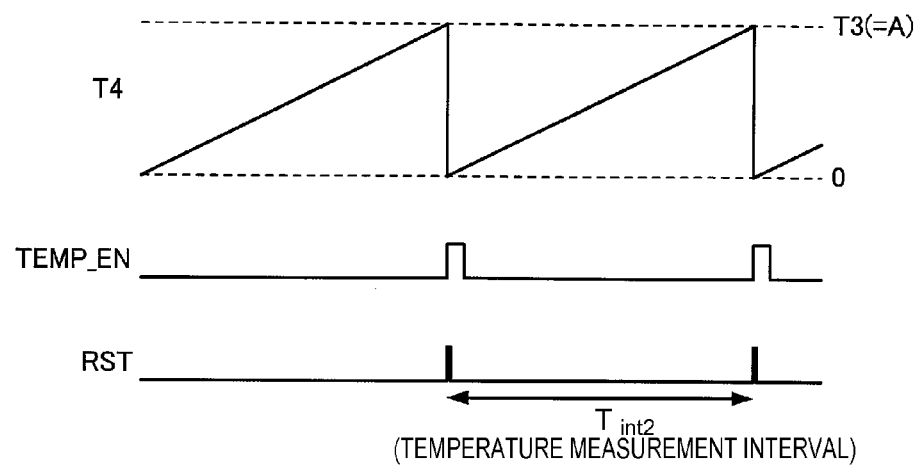
FIGS. 17A and 17B are diagrams showing an example of a timing chart of an operation of the temperature compensation control section in the second embodiment.
Figure 17B:
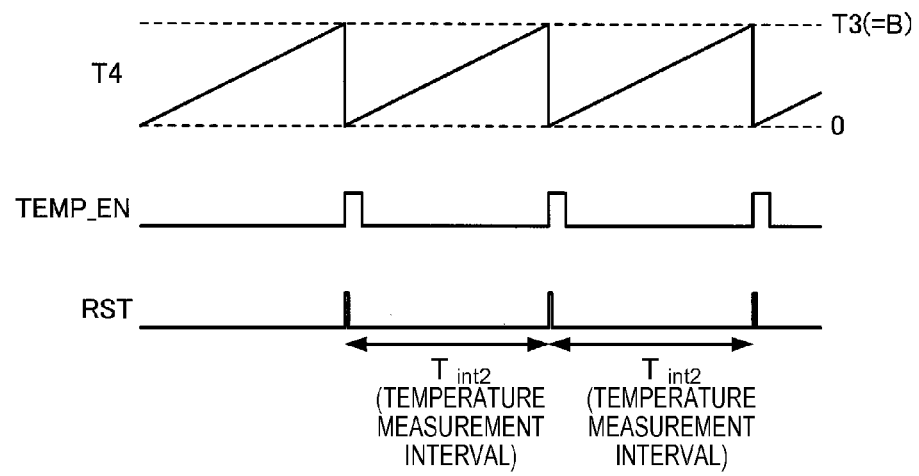

FIGS. 17A and 17B show an example of a timing chart of the count value T4 of the counter 186, the temperature measurement enable signal TEMP_EN, and the reset signal RST. In FIGS. 17A and 17B, the forced enable signal FORCE_EN is always set to the low level, and the intermittent enable signal INT_EN directly corresponds to the temperature measurement enable signal TEMP_EN.

FIG. 17A shows an example of the case of T3=A(>B), namely the case in which the difference between the latest mask number K and the average value (the moving average value) of the N mask numbers K is within the second reference value R2. In contrast, FIG. 17B shows an example of the case of T3=B(<A), namely the case in which the difference between the latest mask number K and the average value (the moving average value) of the N mask numbers K is larger than the second reference value R2 and smaller than the first reference value R1.

Every time the count value T4 of the counter 186 reaches the value T3, the temperature measurement enable signal TEMP_EN is set to the high level for the certain period of time, and a pulse of the reset signal RST occurs, the intervals of which are longer in FIG. 17A and are shorter in FIG. 17B. As described above, the temperature sensor 31 and the A/D converter 32 of the oscillating circuit 30 perform the temperature measurement when the temperature measurement enable signal TEMP_EN is in the high level, and the interval between the timings when the temperature measurement enable signal TEMP_EN is set to the high level (the pulse of the reset signal RST occurs) coincides with the interval time (the measurement interval of the temperature) $T_{int2}$. Specifically, the detection section 187 controls the measurement interval of the temperature in accordance with the value of T3, and the temperature sensor 31 and the A/D converter 32 of the oscillating circuit 30 intermittently perform the temperature measurement every interval time $T_{int2}$.

It should be noted that the value (in reality, the value of T3 for determining the $T_{int2}$) of the interval time $T_{int2}$ is arbitrarily selected taking the environmental condition and the allowable range of the frequency correction error into consideration, and can also be fixed in the design phase, or can also be arranged to be able to be changed by the setting of the internal register or the like.

Since the functional block diagram of the clock generation device 1 according to the second embodiment is the same as that of the first embodiment (FIG. 1), the graphical description and the explanation thereof will be omitted. Further, since the configuration other than the temperature compensation control section 18 in the clock generation device 1 according to the second embodiment is also the same as that of the first embodiment, the graphical description and the explanation thereof will be omitted.

Figure 18:
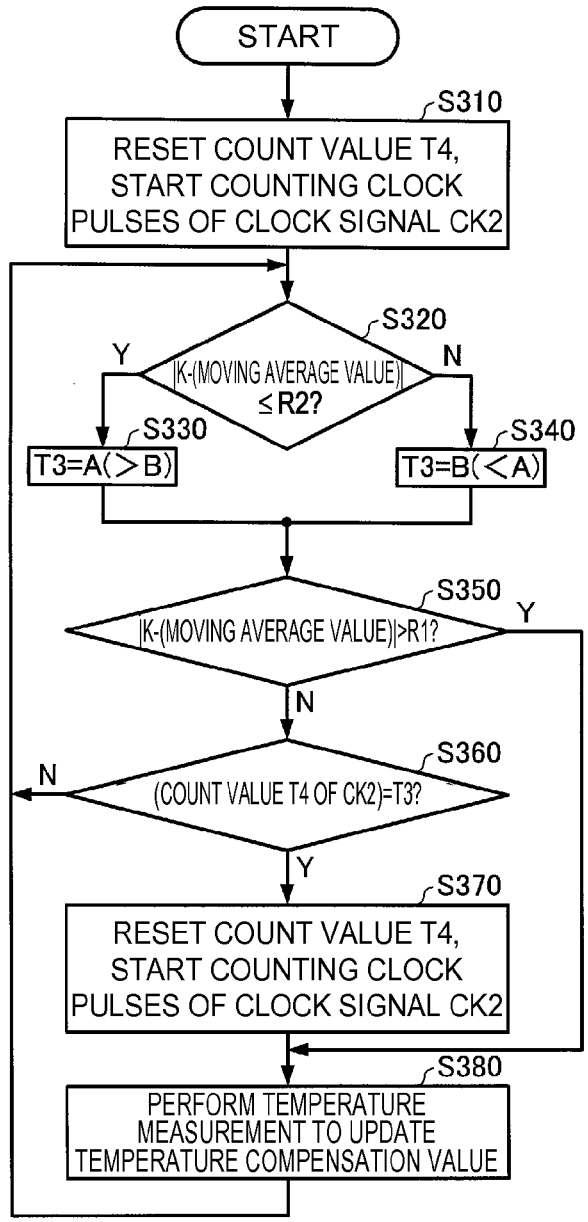
FIG. 18 is a flowchart showing an updating process of a temperature compensation value in the second embodiment.

FIG. 18 is a flowchart showing an updating process of the temperature compensation value in the second embodiment. The update of the temperature compensation value is performed in parallel to the frequency ratio measurement and the frequency correction. It should be noted that since the flowchart of the frequency ratio measurement and the flowchart of the frequency correction in the second embodiment are the same as those of the first embodiment (FIGS. 11A and 11B), the graphical description and the explanation thereof will be omitted.

In the flowchart of the updating process of the temperature compensation value shown in FIG. 18, the clock generation device 1 first resets the count value T4 to start the count of the number of the clock pulses of the clock signal CK2 (S310).

Then, the clock generation device 1 sets T3=A(>B) (S330) if the difference (the absolute value of the difference) between the mask number K (the mask number K obtained in the step S20 shown in FIG. 11A) and the average value (the moving average value) of the last N mask numbers K is within the second reference value R2 (Y in the step S320), or sets T3=B (<A) (S340) if the difference is larger than the second reference value R2 (N in the step S320).

Then, in the case in which the difference between the mask number K and the average value (the moving average value) of the last N mask numbers K is larger than the first reference value R1 (Y in the step S350), the clock generation device 1 sets the temperature measurement enable signal TEMP_EN to the high level only for a certain period of time to perform the temperature measurement, and then updates (S380) the temperature compensation value.

Further, the clock generation device 1 performs the process in the step S320 and the following steps again if the count value T4 of the clock pulses of the clock signal CK2 does not coincide with the value T3 (N in the step S360), or resets the count value T4 and then start (S370) the count of the clock pulses of the clock signal CK2 if the count value T4 coincides with the value T3 (i.e., the interval time $T_{int2}$ elapses) (Y in the step S360).

Further, if the count value T4 coincides with the value T3 (Y in the step S360), the clock generation device 1 sets the temperature measurement enable signal TEMP_EN to the high level only for a certain period of time to perform the temperature measurement, then updates (S380) the temperature compensation value, and then performs the process of the step S320 and the following steps again.

The clock generation device according to the second embodiment explained hereinabove provides substantially the same advantage as in the clock generation device according to the first embodiment. Further, according to the clock generation device according to the second embodiment, since the interval between the temperature measurements performed intermittently in the case in which the difference between the mask number K and the moving average value of the N mask numbers K is smaller than the first reference value R1 is longer in the case in which the difference is within the second reference value R2 (in the case in which the change in the environmental temperature is relatively gentle) than in the case in which the difference is larger than the second reference value R2 (in the case in which the change in the environmental temperature is relatively rapid), the power consumed by the unnecessary temperature measurement can further be reduced compared to the clock generation device according to the first embodiment.

2. ELECTRONIC APPARATUS

Figure 19:
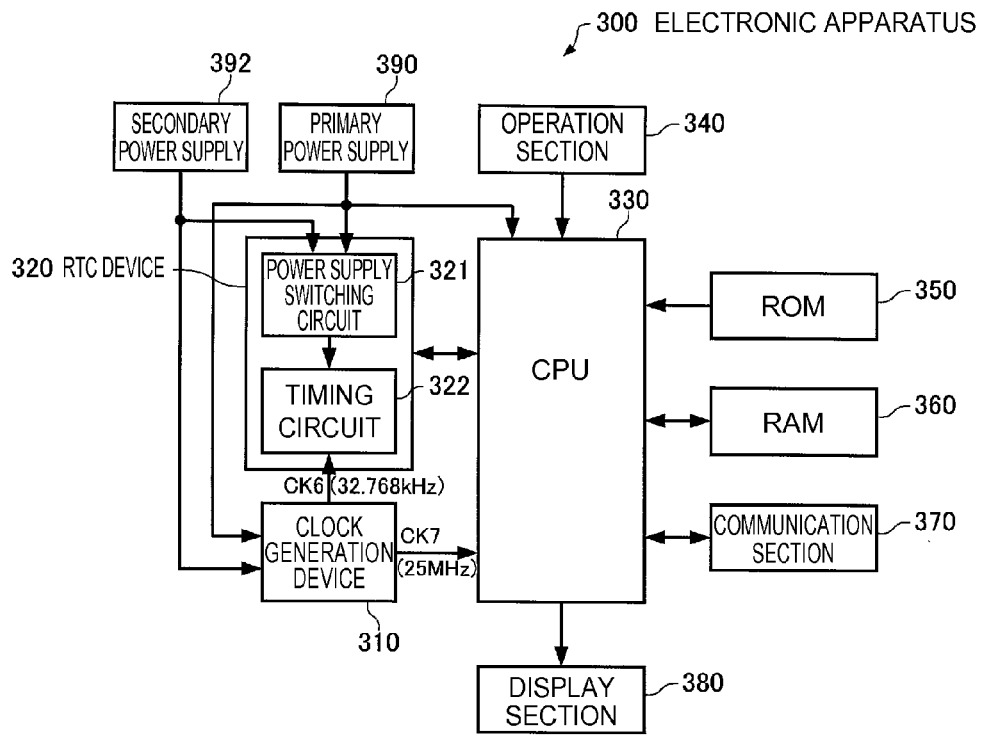
FIG. 19 is a functional block diagram of an electronic apparatus according to an embodiment of the invention.
Figure 20:
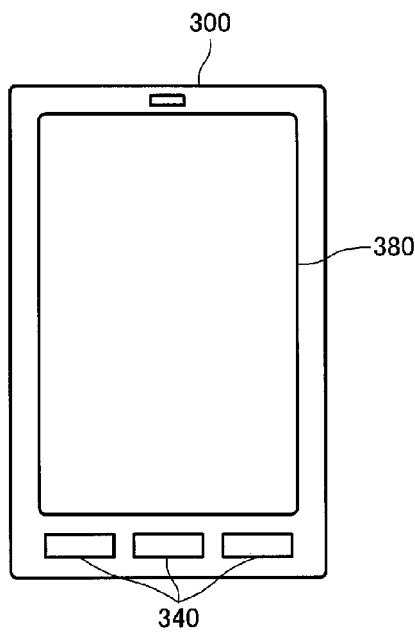
FIG. 20 is a diagram showing an example of an appearance of the electronic apparatus according to the embodiment.

FIG. 19 is a functional block diagram of an electronic apparatus according to the present embodiment. Further, FIG. 20 is a diagram showing an example of the appearance of mobile communication equipment as an example of the electronic apparatus according to the present embodiment.

The electronic apparatus 300 according to the present embodiment is configured including a clock generation device 310, a real-time clock (RTC) device 320, a central processing unit (CPU) 330, an operation section 340, a read only memory (ROM) 350, a random access memory (RAM) 360, a communication section 370, a display section 380, a primary power supply 390, and a secondary power supply 392. It should be noted that the electronic apparatus according to the present embodiment can have a configuration obtained by eliminating or modifying some of the constituents (sections) shown in FIG. 19, or adding another constituent thereto.

The primary power supply 390 is, for example, a power supply such as a lithium-ion battery incorporated in the electronic apparatus 300, or an external AC power supply of the electronic apparatus 300. The secondary power supply 392 is a power supply such as a coin battery incorporated in the electronic apparatus 300.

The clock generation device 310 is, for example, the clock generation device 1 according to the first embodiment or the second embodiment described above, and outputs both of the clock signal CK6 (32.768 kHz) and the clock signal CK7 (25 MHz) when the power supply voltage of the primary power supply 390 is supplied, and outputs the clock signal CK6 (32.768 kHz) but does not output the clock signal CK7 (25 MHz) when the power supply voltage of the primary power supply 390 is not supplied as explained above.

The real-time clock device 320 is, for example, a one-chip IC including a power supply switching circuit 321, and a timing circuit 322 supplied with an output voltage of the power supply switching circuit 321 as the power supply voltage. The power supply switching circuit 321 supplies the timing circuit 322 with the power supply voltage of the primary power supply 390 when the power supply voltage of the primary power supply 390 is supplied, and switches the power supply voltage to be supplied to the timing circuit 322 to the power supply voltage of the secondary power supply 392 when the supply of the power supply voltage of the primary power supply 390 stops. The timing circuit 322 performs a timing process in sync with the clock signal CK6 output by the clock generation device 310.

The CPU 330 operates with the primary power supply 390, and performs a variety of calculation processes and control processes in accordance with programs stored in the ROM 350 and so on. Specifically, the CPU 330 performs a variety of processes corresponding to the operation signal from the operation section 340, a process of controlling the communication section 370 for performing data communication with external devices, a process of transmitting a display signal for making the display section 380 display a variety of types of information, and so on in sync with the clock signal CK7 output by the clock generation device 310.

The operation section 340 is an input device including operation keys, button switches, and so on, and outputs the operation signal corresponding to the operation by the user to the CPU 330.

The ROM 350 stores programs, data, and so on for the CPU 330 to perform a variety of arithmetic processes and control processes.

The RAM 360 is used as a working area of the CPU 330, and temporarily stores, for example, the program and data retrieved from the ROM 350, the data input from the operation section 340, and the calculation result obtained by the CPU 330 performing operations in accordance with the variety of programs.

The communication section 370 performs a variety of control processes for achieving the data communication between the CPU 330 and the external devices.

The display section 380 is a display device formed of a liquid crystal display (LCD) or the like, and displays a variety of information based on the display signal input from the CPU 330. The display section 380 can also be provided with a touch panel functioning as the operation section 340.

By incorporating the clock generation device 1 according to the present embodiment as the clock generation device 310, an electronic apparatus high in reliability and lower in cost can be realized.

As such an electronic apparatus 300, a variety of electronic apparatuses can be adopted, and there can be cited, for example, a personal computer (e.g., a mobile type personal computer, a laptop personal computer, a notebook personal computer, and a tablet personal computer), a mobile terminal such as a cellular phone, a digital still camera, an inkjet ejection device (e.g., an inkjet printer), a storage area network apparatus such as a router or a switch, a local area network apparatus, a television set, a video camera, a video cassette recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

3. MOVING OBJECT

Figure 21:
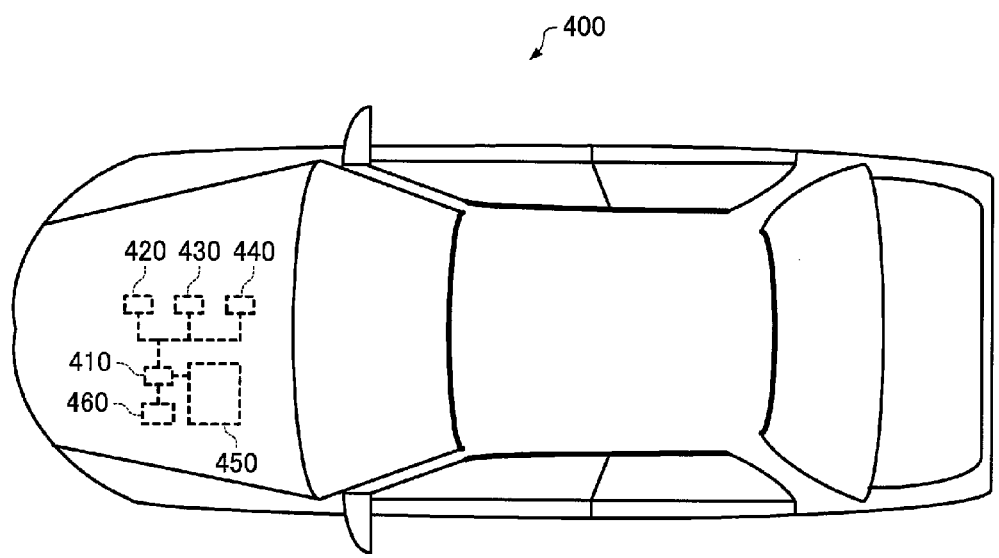
FIG. 21 is a diagram showing an example of a moving object according to an embodiment of the invention.

FIG. 21 is a diagram (a top view) showing an example of a moving object according to the present embodiment. The moving object 400 shown in FIG. 16 is configured including a clock generation device 410, controllers 420, 430, and 440 for performing a variety of types of control such as an engine system, a brake system, or a keyless entry system in sync with a variety of clock signals output by the clock generation device 410, a battery 450, and a backup battery 460. It should be noted that the moving object according to the present embodiment can have a configuration obtained by eliminating or modifying some of the constituents (sections) shown in FIG. 21, or adding another constituent thereto.

The clock generation device 1 according to each of the embodiments described above can be applied as the clock generation device 410, and thus, a high reliability can be ensured.

As such a moving object 400, a variety of types of moving objects can be adopted, and a vehicle (including an electric vehicle), an aircraft such as a jet plane or a helicopter, a ship, a rocket, an artificial satellite, and so on can be cited.

4. MODIFIED EXAMPLES

The invention is not limited to the embodiments described above, but can be put into practice with various modifications within the scope or the spirit of the invention.

For example, although in the present embodiment, the explanation is presented citing the clock generation device 1 realized by a single IC as an example, the clock generation device 1 can also be realized by a plurality of ICs, or can also be realized by connecting a plurality of discrete components corresponding respectively to the plurality of constituents of the clock generation device 1 on a board with wiring.

Further, for example, although in the clock generation device 1 according to the present embodiment, the clock signal CK5 is selected as the clock signal CK6 when the power supply voltage VDD1 of the primary power supply is supplied, and the clock signal CK2 is selected as the clock signal CK6 when the power supply voltage VDD1 of the primary power supply is not supplied, and the clock signal thus selected is output to the outside, it is also possible to arrange that the clock generation device 1 always outputs the clock signal CK2 (corresponding to the second clock signal), which is generated by masking some clock pulses of the clock signal CK1 (corresponding to the first clock signal). In this case, the frequency conversion section 15 and the clock selection section 16 can be eliminated.

Further, for example, in the clock generation device 1 according to the second embodiment, it is also possible that the comparison section 183 of the temperature compensation control section 18 compares the output value of the average value output section 182 with n (n≥2) reference values R1, R2, R3, . . . , Rn (R1>R2>R3> . . . >Rn), and then forcibly sets the temperature measurement enable signal TEMP_EN to the high level for a certain period of time if the output value of the average value output section 182 is larger than the reference value R1, or determines which one of n+1 ranges, namely a range larger than R2 and no larger than R1, a range larger than R3 and no larger than R2, . . . , and a range no larger than Rn, the output value of the average value output section 182 is included, and then selects the value of T1 from n values in accordance with the determination result if the output value of the average value output section 182 is equal to or smaller than the reference value R1. According to this configuration, since the measurement interval of the temperature can more finely be set in accordance with the moving average value of the mask numbers K, it becomes possible to further reduce the power consumption while keeping the frequency accuracy.

Further, for example, although in the clock generation device 1 according to the present embodiment, the clock signal CK3 output by the crystal oscillator constituted by the crystal vibrator 2 and the oscillating circuit 30 is used as the clock signal to be the reference of the frequency ratio measurement, it is also possible to use the output clock signal of a variety of types of oscillators such as a temperature-compensated crystal oscillator (an oven controlled crystal oscillator (OCXO)), an atomic oscillator, a temperature-compensated MEMS (micro electromechanical systems) oscillator.

Further, for example, although in the clock generation device 1 according to the present embodiment, the average value output section 182 calculates the moving average value of the N mask numbers K every time a mask number K is newly stored in the FIFO memory 181, it is also possible to arrange that the average value calculation section 182 calculates the moving average value of the N mask numbers K every time m (2≤m≤N) mask numbers K are newly stored in the FIFO memory 181.

The embodiments and the modified examples described above are illustrative only, and the invention is not limited to the embodiments and the modified examples. For example, it is also possible to arbitrarily combine the embodiments and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations exerting the same functions and advantages and configurations capable of achieving the same object as the configuration described as the embodiment of the invention. Further, the invention includes configurations obtained by adding known technologies to the configuration described as the embodiment of the invention.

The entire disclosure of Japanese Patent Application No. 2013-227071, filed Oct. 31, 2013 is expressly incorporated by reference herein.

What is claimed is:

1. A clock generation device adapted to
measure a frequency ratio between a first clock signal and a reference frequency value based on a third clock signal,
generate a second clock signal obtained by masking at least one clock pulse of the first clock signal based on the measurement result of the frequency ratio, and
update a compensation value of a frequency-temperature characteristic of the third clock signal in a case in which a difference between the measurement result of the frequency ratio and an average value of N (N is a natural number) measurement results of the frequency ratio is larger than a first reference value.

2. The clock generation device according to claim 1, wherein
the compensation value is intermittently updated in a case in which the difference is within the first reference value.

3. The clock generation device according to claim 1, comprising:
a clock gate section adapted to generate the second clock signal;
a frequency measurement section adapted to measure the frequency ratio;
an oscillating circuit including a compensation device adapted to output the compensation value, and outputting the third clock signal on which temperature compensation is performed based on the compensation value;
an average value output section adapted to output the average value; and
a comparison section adapted to compare the measurement result of the frequency ratio and the average value with each other, and make the compensation device update the compensation value in a case in which the difference is larger than the first reference value.

4. The clock generation device according to claim 2, further comprising:
a clock gate section adapted to generate the second clock signal;
a frequency measurement section adapted to measure the frequency ratio;
an oscillating circuit including a compensation device adapted to output the compensation value, and outputting the third clock signal on which temperature compensation is performed based on the compensation value;
an average value output section adapted to output the average value; and
a comparison section adapted to compare the measurement result of the frequency ratio and the average value with each other, and make the compensation device update the compensation value in a case in which the difference is larger than the first reference value.

5. The clock generation device according to claim 3, wherein
the compensation device includes a temperature detection section adapted to output a temperature detection signal, and
the comparison section makes the temperature detection section update the temperature detection signal to be output in a case in which the difference is larger than the first reference value.

6. The clock generation device according to claim 1, wherein
an update interval of the compensation value is controlled based on the difference.

7. The clock generation device according to claim 3, further comprising:
a detection section,
wherein the comparison section outputs a value corresponding to the difference, and
the detection section compares a number of clock pulses of the second clock signal and the output value of the comparison section with each other, and controls the update interval of the compensation value based on the comparison result.

8. The clock generation device according to claim 7, wherein
the comparison section outputs a larger value in a case in which the difference is within a second reference value smaller than the first reference value than a value output in a case in which the difference is larger than the second reference value.

9. The clock generation device according to claim 1, wherein
the average value is a moving average value of the N measurement results of the frequency ratio.

10. An electronic apparatus comprising:
the clock generation device according to claim 1.

11. The electronic apparatus according to claim 10, further comprising:
a real-time clock device adapted to generate time information in sync with the second clock signal output by the clock generation device.

12. A moving object comprising:
the clock generation device according to claim 1.

13. A clock generation method comprising:
measuring a frequency ratio between a first clock signal and a reference frequency value based on a third clock signal;
generating a second clock signal obtained by masking at least one clock pulse of the first clock signal based on the measurement result of the frequency ratio; and
updating a compensation value of a frequency-temperature characteristic of the third clock signal in a case in which a difference between the measurement result of the frequency ratio and an average value of N (N is a natural number) measurement results of the frequency ratio is larger than a first reference value.

* * * * *